(12) United States Patent
Oh et al.

(10) Patent No.: US 12,278,225 B2
(45) Date of Patent: Apr. 15, 2025

(54) DISPLAY MODULE, DISPLAY APPARATUS, AND METHOD OF MANUFACTURING THE SAME

(71) Applicant: SAMSUNG ELECTRONICS CO., LTD., Suwon-si (KR)

(72) Inventors: Jongsu Oh, Suwon-si (KR); Sangyoung Park, Suwon-si (KR); Hoseop Lee, Suwon-si (KR); Tetsuya Shigeta, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 605 days.

(21) Appl. No.: 17/675,046

(22) Filed: Feb. 18, 2022

(65) Prior Publication Data
US 2022/0223577 A1 Jul. 14, 2022

Related U.S. Application Data

(63) Continuation of application No. PCT/KR2021/016814, filed on Nov. 16, 2021.

(30) Foreign Application Priority Data

Nov. 20, 2020 (KR) .................. 10-2020-0157081

(51) Int. Cl.
H01L 25/16 (2023.01)
G09G 3/32 (2016.01)
(Continued)

(52) U.S. Cl.
CPC ............. *H01L 25/167* (2013.01); *G09G 3/32* (2013.01); *H01L 25/162* (2013.01);
(Continued)

(58) Field of Classification Search
CPC ............. G09G 3/32; G09G 2300/0804; G09G 2330/02; H05K 1/0298; H05K 5/0017;
(Continued)

(56) References Cited

U.S. PATENT DOCUMENTS 8,803,857 B2 8/2014 Cok
9,367,094 B2 6/2016 Bibl et al.
(Continued)

FOREIGN PATENT DOCUMENTS

KR 10-2012-0075147 A 7/2012
KR 10-2013-0013955 A 2/2013
(Continued)

OTHER PUBLICATIONS

International Search Report (PCT/ISA/210) dated Mar. 8, 2022 issued by the International Searching Authority in International Application No. PCT/KR2021/016814.
(Continued)

*Primary Examiner* — Shih Tsun A Chou
(74) *Attorney, Agent, or Firm* — Sughrue Mion, PLLC

(57) ABSTRACT

A display module is provided. The display module includes a plurality of pixels, a first substrate, a plurality of micro pixel packages provided on the first substrate, and a plurality of voltage lines electrically connected between a set of micro pixel packages of the plurality of micro pixel packages that are adjacent to each other in a first direction. Each of the plurality of micro pixel packages includes a second substrate, a plurality of inorganic light-emitting elements
(Continued)

provided on the second substrate, and a micro pixel controller provided on the second substrate and configured to control the plurality of inorganic light-emitting elements.

15 Claims, 31 Drawing Sheets

(51) Int. Cl.
  *H05K 1/02* (2006.01)
  *H05K 1/14* (2006.01)
  *H05K 1/18* (2006.01)
  *H05K 5/00* (2025.01)
  *H05K 5/30* (2025.01)

(52) U.S. Cl.
  CPC .......... *H05K 1/0298* (2013.01); *H05K 1/181* (2013.01); *G09G 2300/0804* (2013.01); *G09G 2330/02* (2013.01); *H05K 1/142* (2013.01); *H05K 5/0017* (2013.01); *H05K 5/30* (2025.01); *H05K 2201/09227* (2013.01); *H05K 2201/10378* (2013.01)

(58) Field of Classification Search
  CPC ....... H05K 5/0021; H05K 2201/09227; H05K 2201/10378; H01L 25/0753
  See application file for complete search history.

(56) References Cited

U.S. PATENT DOCUMENTS

| | | |
|---|---|---|
| 9,626,908 B2 | 4/2017 | Sakariya et al. |
| 10,091,446 B2 | 10/2018 | Cok et al. |
| 2011/0069094 A1 | 3/2011 | Knapp |
| 2012/0229039 A1 | 9/2012 | Kang |
| 2016/0267821 A1* | 9/2016 | Cross .................... G09F 9/3026 |
| 2017/0256522 A1* | 9/2017 | Cok ........................ H01L 25/50 |
| 2018/0226386 A1 | 8/2018 | Cok |
| 2020/0020676 A1 | 1/2020 | Cok et al. |

FOREIGN PATENT DOCUMENTS

| | | |
|---|---|---|
| KR | 10-2014-0051152 A | 4/2014 |
| KR | 10-2016-0075689 A | 6/2016 |
| KR | 10-1783451 B1 | 10/2017 |
| KR | 10-1971979 B1 | 4/2019 |

OTHER PUBLICATIONS

Communication dated Sep. 25, 2024, issued by European Patent Office in European Patent Application No. 21895075.6.

* cited by examiner

FIG. 12
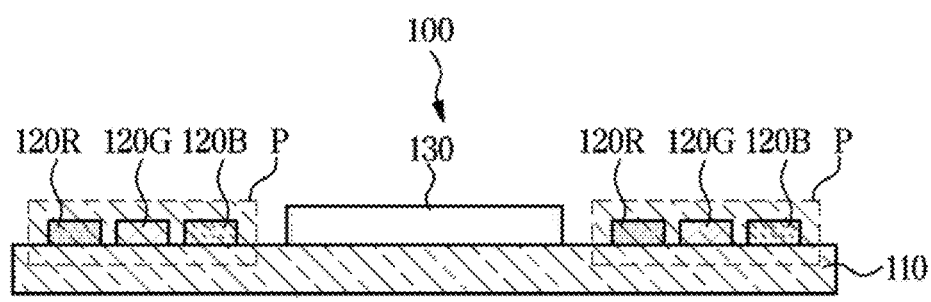
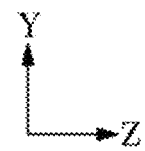

FIG. 28
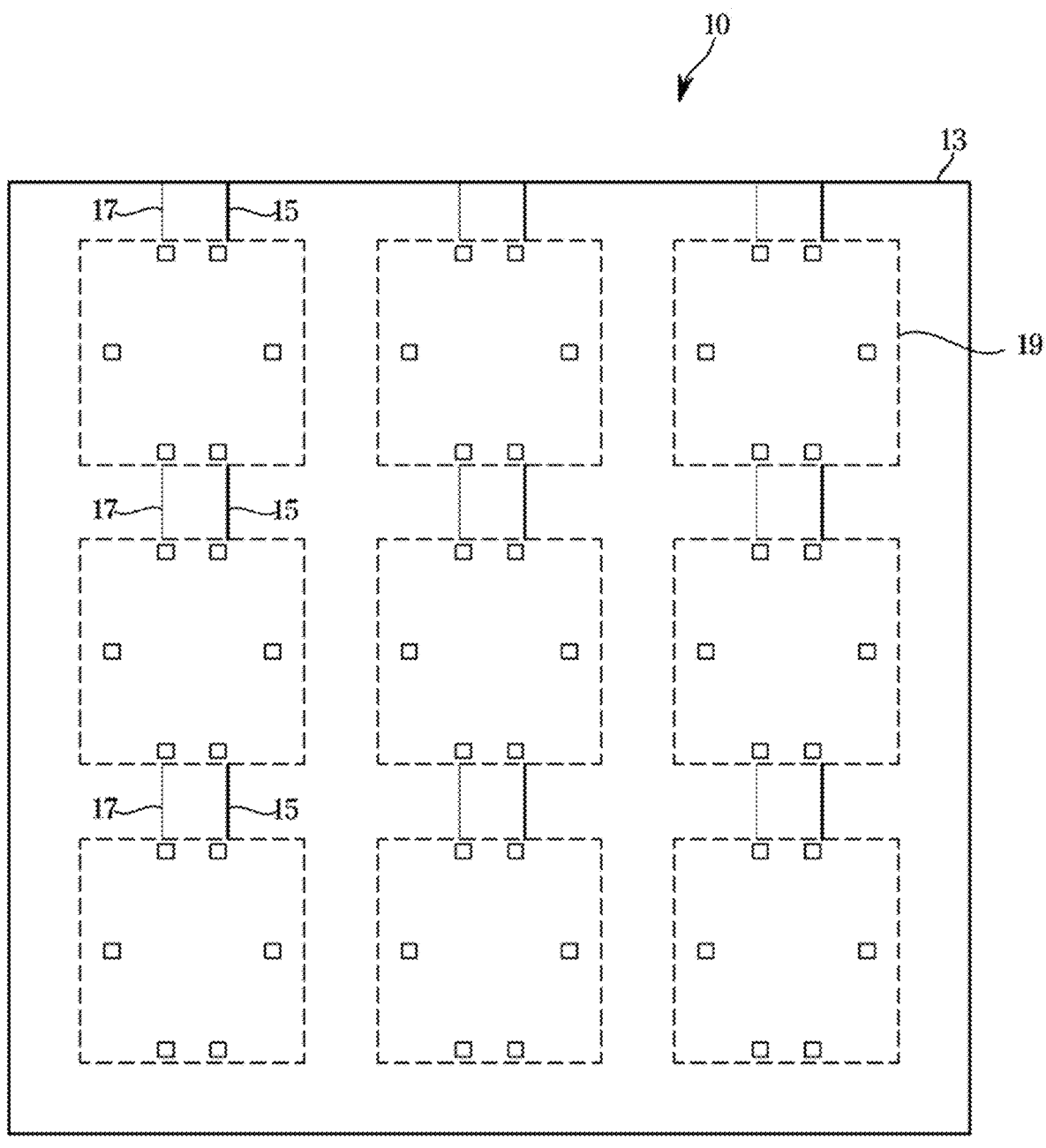
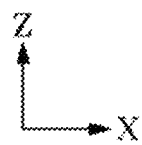

DISPLAY MODULE, DISPLAY APPARATUS, AND METHOD OF MANUFACTURING THE SAME

CROSS-REFERENCE TO RELATED APPLICATION(S)

This application is a bypass continuation of International Application No. PCT/KR2021/016814, filed on Nov. 16, 2021, which is based on and claims priority to Korean Patent Application No. 10-2020-0157081, filed on Nov. 20, 2020, in the Korean Patent Office, the disclosures of which are incorporated by reference herein in their entireties BACKGROUND

1. FIELD

The disclosure relates to a display module, a display apparatus, and a manufacturing method thereof, which implement an image using an inorganic light-emitting element.

2. DESCRIPTION OF RELATED ART

A display apparatus may be classified into a self-emitting display in which each pixel emits light by itself and a passive light-emitting display that requires a separate light source.

A liquid crystal display (LCD) is a passive light-emitting display, and needs a backlight unit configured to supply light from the rear of a display panel, a liquid crystal layer configured to serve as a switch to transmit/block light, a color filter configured to change supplied light to a desired color, and the like. Thus, the LCD is complex in structure and has a limitation in realizing a small thickness.

On the other hand, in the self-emitting display in which each pixel emits light by itself by including a light-emitting element for each pixel, components such as a backlight unit and a liquid crystal layer are not required and a color filter can also be omitted. Thus, the self-emitting display is structurally simple and may have a high degree of freedom in design. In addition, the self-emitting display may realize not only a small thickness, but also an excellent contrast ratio, brightness, and viewing angle.

Among self-emitting displays, a micro light-emitting diode (LED) display is one of flat panel displays and includes a plurality of LEDs each having a size of about 100 micrometers. In comparison with the LCD that requires a backlight, the micro-LED display may provide better contrast, response time, and energy efficiency.

Further, the micro-LED, which is an inorganic light-emitting element, has higher brightness, better light emission efficiency, and a longer lifespan in comparison with an organic light-emitting diode (OLED), which requires a separate encapsulation layer for protecting organic materials.

SUMMARY

Provided are a display module, a display apparatus, and a method of manufacturing the display module, in which power lines with improved resistance are provided and a current-resistance (IR) drop is minimized as compared to a case in which the power lines are formed on a module substrate by forming some of the power lines in a micro pixel controller or a micro pixel package.

Technical Solution

According to an aspect of the disclosure, a display module may include a plurality of pixels, a first substrate, a plurality of micro pixel packages provided on the first substrate, and a plurality of voltage lines electrically connected between a set of micro pixel packages of the plurality of micro pixel packages that are adjacent to each other in a first direction. Each of the plurality of micro pixel packages may include a second substrate, a plurality of inorganic light-emitting elements provided on the second substrate, a micro pixel controller provided on the second substrate and configured to control the plurality of inorganic light-emitting elements, and an internal connection line disposed in the second substrate and configured to electrically connect a first voltage line of the plurality of voltage lines that is electrically connected to a first micro pixel package of the set of micro pixel packages that are adjacent to each other in the first direction and a second voltage line of the plurality of voltage lines that is electrically connected to a second micro pixel package of the set of micro pixel packages that are adjacent to each other in the first direction.

Each of the plurality of voltage lines may transmit a voltage between the plurality of micro pixel packages.

Each of the plurality of micro pixel packages may receive a voltage through the first voltage line, and outputs an input voltage to the second voltage line through the internal connection line.

The internal connection line may include an electron mobility higher than that of each of the plurality of voltage lines.

The plurality of micro pixel packages may include a first plurality of micro pixel packages, each of which is configured to receive a voltage from a power board and transmit the voltage to a micro pixel package that is adjacent thereto in the first direction through a corresponding voltage line, and a second plurality of micro pixel packages, each of which is configured to receive a voltage from a micro pixel package that is adjacent thereto in the first direction.

The internal connection line may be electrically connected to the plurality of inorganic light-emitting elements and the micro pixel controller, and may transmit a voltage input from any one of the set of micro pixel packages to each of the plurality of inorganic light-emitting elements and the micro pixel controller.

The internal connection line may include a first internal connection line through which a power supply voltage flows, and a second internal connection line through which a reference voltage flows, the first internal connection line may be electrically connected to the micro pixel controller and transmits the power supply voltage thereto, and the second internal connection line may be electrically connected to the plurality of inorganic light-emitting elements and transmits the reference voltage thereto.

Each of the plurality of pixels may include two or more inorganic light-emitting elements among the plurality of inorganic light-emitting elements, and the plurality of inorganic light-emitting elements may include two or more pixels among the plurality of pixels.

The micro pixel controller may include a third substrate, and at least one thin-film transistor disposed on the third substrate. The at least one thin-film transistor may switch the plurality of inorganic light-emitting elements and supplies a driving current to the plurality of inorganic light-emitting elements.

According to an aspect of the disclosure, a display apparatus may include a plurality of display modules comprising a plurality of pixels, and a frame configured to support the plurality of display modules. Each of the plurality of display modules may include a first substrate, a plurality of micro pixel packages provided on the first substrate, and a plurality of voltage lines electrically connected between a set of micro pixel packages that are adjacent to each other in a first direction. Each of the plurality of micro pixel packages may include a second substrate, a plurality of inorganic light-emitting elements provided on the second substrate, a micro pixel controller provided on the second substrate and configured to control the plurality of inorganic light-emitting elements, and an internal connection line disposed in the second substrate and configured to electrically connect a first voltage line of the plurality of voltage lines that is electrically connected to a first micro pixel package of the set of micro pixel packages that are adjacent to each other in the first direction and a second voltage line of the plurality of voltage lines that is electrically connected to a second micro pixel package of the set of micro pixel packages that are adjacent to each other in the first direction.

Each of the plurality of voltage lines may transmit a voltage between the plurality of micro pixel packages.

Each of the plurality of micro pixel packages may receive a voltage through the first voltage line, and outputs an input voltage to the second voltage line through the internal connection line.

The internal connection line may include an electron mobility higher than that of each of the plurality of voltage lines.

The plurality of micro pixel packages may include a first plurality of micro pixel packages, each of which is configured to receive a voltage from a power board and transmit the voltage to a micro pixel package that is adjacent thereto in the first direction through a corresponding voltage line, and a second plurality of micro pixel packages, each of which is configured to receive a voltage from a micro pixel package that is adjacent thereto in the first direction.

The internal connection line may be electrically connected to the plurality of inorganic light-emitting elements and the micro pixel controller, and may transmit a voltage input from any one of the set of micro pixel packages to each of the plurality of inorganic light-emitting elements and the micro pixel controller.

According to a display module and a display apparatus, power lines with improved resistance may be provided and a current-resistance (IR) drop may be minimized as compared to a case in which the power lines are formed on a module substrate by forming some of the power lines in a micro pixel controller or a micro pixel package.

BRIEF DESCRIPTION OF THE DRAWINGS

FIG. 12 is a side cross-sectional view of a micro pixel package included in the display module according to an embodiment.

FIGS. 26, 27, 28, 29, 30 and 31 are diagrams illustrating a display module manufactured by some operations shown in FIG. 25, according to an embodiment.

DETAILED DESCRIPTION

Figure 1:
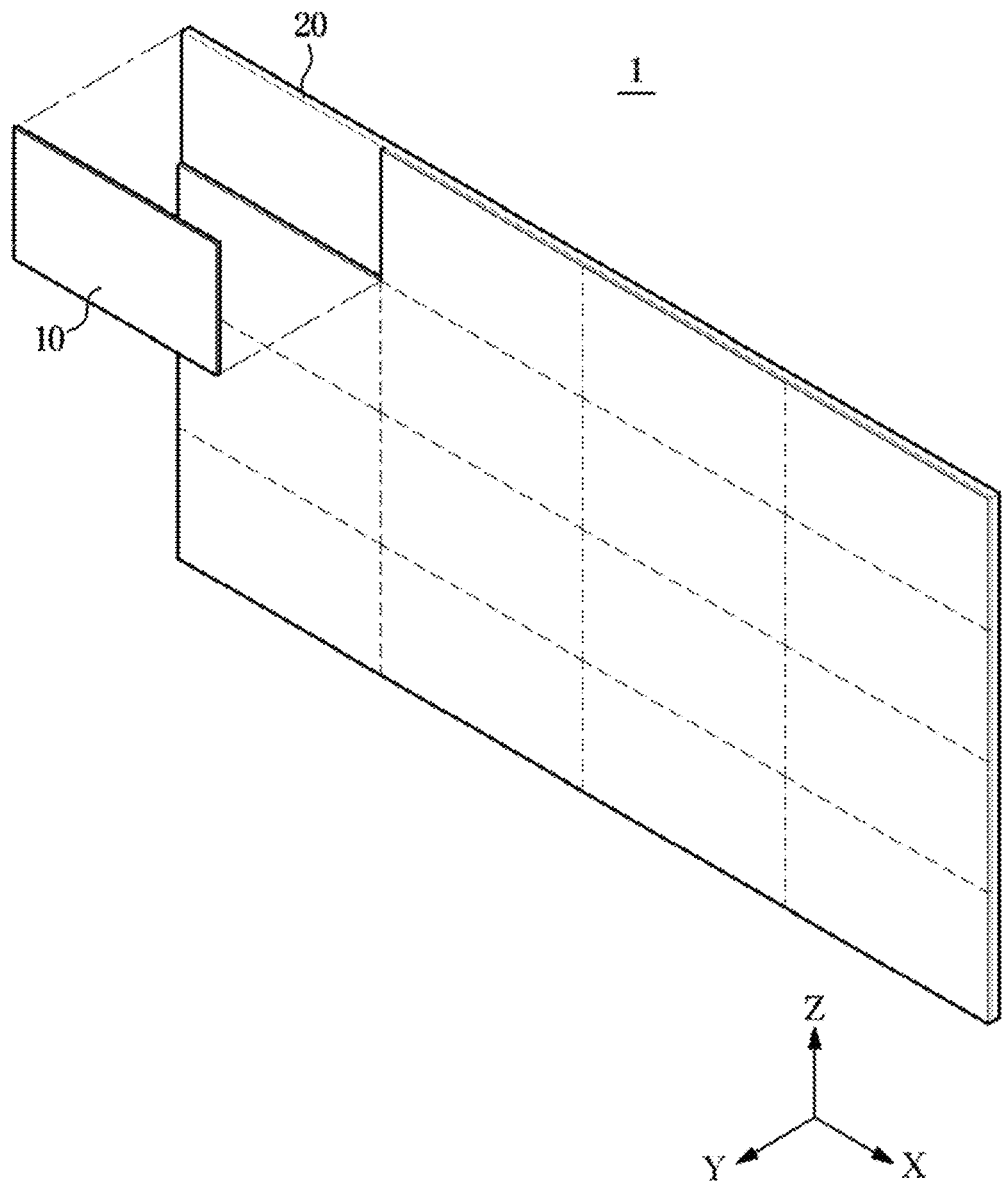
FIG. 1 is a diagram illustrating an example of a display module and a display apparatus having the same according to an embodiment.

Embodiments disclosed in the present specification and the components shown in the drawings are merely example embodiments of the disclosure and various modifications capable of replacing the embodiments and drawings of the present specification may be made at the time of filing the present application.

Throughout the present specification, when a part is referred to as being "connected" to other parts, it includes not only a direct connection but also an indirect connection, and the indirect connection includes a connection through a wireless communication network.

Further, terms used herein are used to illustrate the embodiments and are not intended to limit and/or to restrict the disclosed embodiments. As used herein, singular forms are intended to include plural forms as well, unless the context clearly indicates otherwise. Terms "comprise," "have," and the like are used herein to specify the presence of stated features, numerals, steps, operations, components, parts or combinations thereof but do not preclude the presence or addition of one or more other features, numerals, steps, operations, components, parts, or combinations thereof.

Further, terms including ordinal numbers such as "first," "second," and the like used herein may be used to describe various components, but the components are not limited by these terms. The terms are used merely for the purpose of distinguishing one component from another. For example, without departing from the scope of the present disclosure, a first component may be referred to as a second component, and similarly, a second component may be referred to as a first component.

Further, terms such as "unit," "portion," "block," "member," "module" may refer to a unit of processing at least one function or operation. For example, these terms may refer to at least one process implemented by software, a hardware component such as a field-programmable gate array (FPGA) or an application-specific integrated circuit (ASIC), or a combination of software and hardware.

A reference numeral attached in each of operations is used to identify each of the operations, and this reference numeral does not describe the order of the operations, and the operations may be performed differently from the described order unless clearly specified in the context.

Hereinafter, embodiments of the present disclosure will be described in detail with reference to the accompanying drawings.

Figure 2:
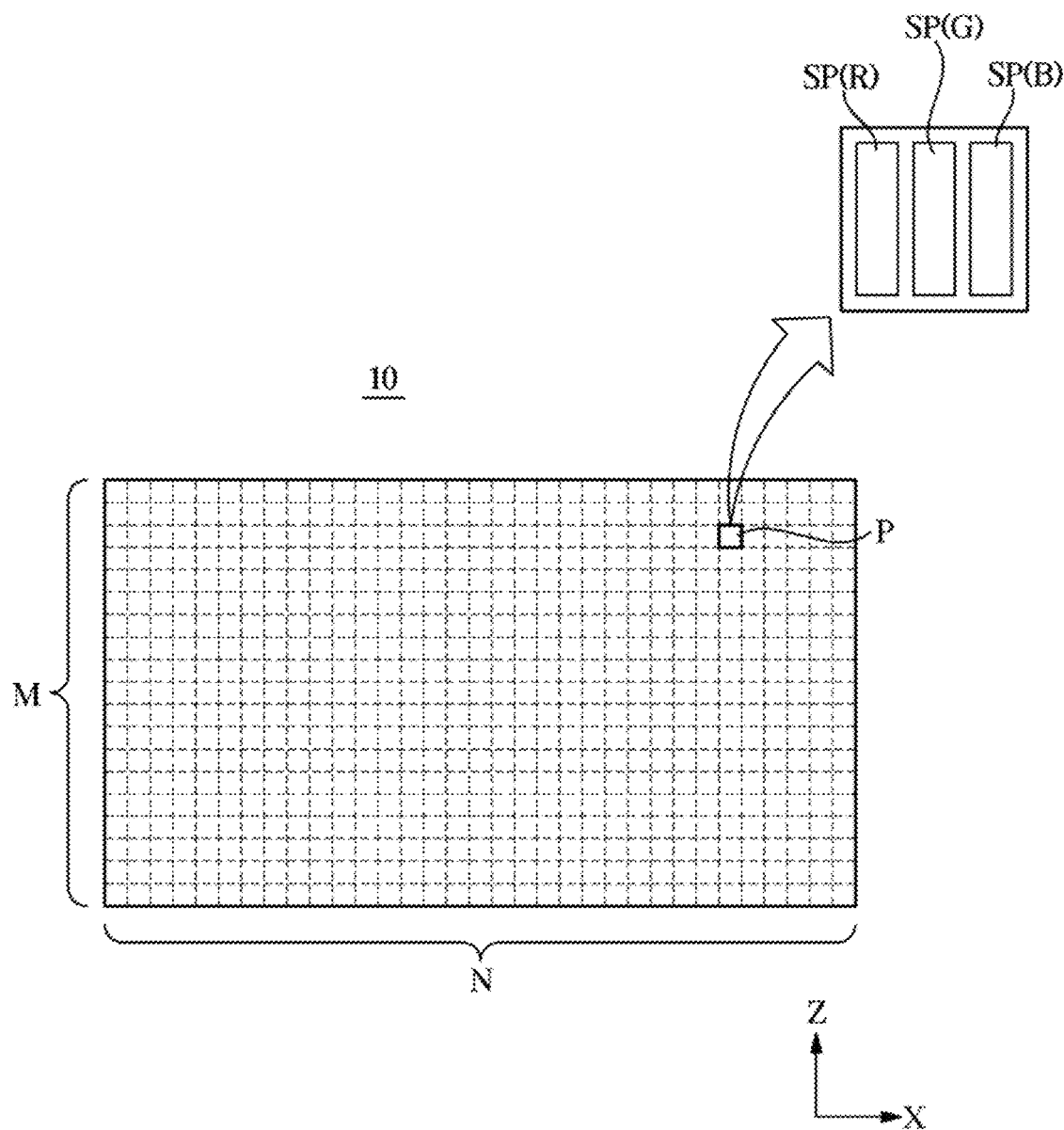
FIG. 2 is a diagram illustrating an example of an arrangement of pixels constituting a unit module of a display apparatus according to an embodiment.

FIG. 1 is a diagram illustrating an example of a display module and a display apparatus having the same according to an embodiment. FIG. 2 is a diagram illustrating an example of an arrangement of pixels constituting a unit module of a display apparatus according to an embodiment.

A display apparatus 1 according to one embodiment is a self-emitting display apparatus in which a light-emitting element is disposed for each pixel so that each pixel may emit light by itself. Accordingly, unlike a liquid crystal display (LCD) apparatus, since a component such as a backlight unit, a liquid crystal layer, or the like is not required, it is possible to realize a small thickness, and various design changes are possible due to the simple structure.

Further, the display apparatus 1 according to an embodiment may employ an inorganic light-emitting element, such as an inorganic light-emitting diode (LED), as the light-emitting element disposed in each pixel. The inorganic light-emitting element has a faster response speed than an organic light-emitting element such as an organic light-emitting diode (OLED), and may realize high luminance with low power.

In addition, in comparison with the organic light-emitting element that requires an encapsulation process because the organic light-emitting element is vulnerable to exposure to moisture and oxygen and has poor durability, the inorganic light-emitting element does not require the encapsulation process and has better durability. Hereinafter, the inorganic light-emitting element mentioned in the embodiment described below may refer to an inorganic LED.

The inorganic light-emitting element employed in the display apparatus 1 according to one embodiment may be a micro-LED having a short side length of about 100 μm. As described above, by employing the micro-scale LED, a pixel size may be reduced and a higher resolution may be realized within the same size screen.

In addition, when an LED chip is manufactured in the size of a micro unit, it is possible to solve a problem in which the LED chip is broken due to characteristics of inorganic materials upon being bent. That is, when the micro-LED chip is transferred to a flexible substrate, the LED chip is not broken even when the substrate is bent, so that a flexible display apparatus may also be implemented.

A display apparatus employing a micro-LED may be applied to various fields by using a very small pixel size and a thin thickness. As an example, as shown in FIG. 1, by tiling a plurality of display modules 10, to each of which a plurality of micro-LEDs are transferred, and by fixing the plurality of display modules 10 to a housing 20, it is possible to implement a large-area screen, and a display apparatus of the large-area screen may be used as a signage, an electric billboard, or the like.

A three-dimensional coordinate system of XYZ axes shown in FIG. 1 is based on the display apparatus 1, a plane on which a screen of the display apparatus 1 is located is an XZ plane, and a direction in which an image is output or an inorganic light-emitting element emits light is a +Y direction. Since the coordinate system is based on the display apparatus 1, the same coordinate system may be applied to both cases in which the display apparatus 1 is lying down and the display apparatus 1 is upright.

In general, the display apparatus 1 is used in an upright state, and a user views an image in the front of the display apparatus 1, so that the +Y direction in which the image is output is referred to as a front side, and a direction opposite to the front side may be referred to as a rear side.

Further, the display apparatus 1 is generally manufactured in a state of lying down. Accordingly, a −Y direction of the display apparatus 1 may be referred to as a downward direction, and the +Y direction may be referred to as an upward direction. That is, in the embodiment described below, the +Y direction may be referred to as the upward direction or may also be referred to as the front side, and the −Y direction may be referred to as the downward direction or may also be referred to as the rear side.

The other four surfaces except for an upper surface and a lower surface of the flat-panel-type display apparatus 1 or display module 10 are referred to as side surfaces regardless of a posture of the display apparatus 1 or the display module 10.

In the example of FIG. 1, the display apparatus 1 is illustrated as implementing a large-area screen by including the plurality of display modules, but the embodiment of the display apparatus 1 is not limited thereto. The display apparatus 1 may also be implemented as a television (TV), a wearable device, a portable device, a monitor for a personal computer (PC), and the like by including a single display module 10.

Referring to FIG. 2, the display module 10 may have a two-dimensional pixel structure of an M×N (where M and N are integers greater than or equal to two) array. That is, the display module 10 may have a pixel array composed of M rows and N columns. In other words, the display module 10 may include a plurality of pixels arranged two dimensionally. FIG. 2 conceptually illustrates a pixel arrangement, and thus, of course, in the display module 10, in addition to an active region in which the pixels are arranged, a bezel region or a line region in which an image is not displayed may also be located.

In this embodiment, when it is described that certain components are arranged two dimensionally, this may include a case in which the corresponding components are arranged on the same plane as well as a case in which the corresponding components are arranged on different planes parallel to each other. In addition, in the case in which the corresponding components are disposed on the same plane, upper ends of the arranged components do not necessarily have to be located on the same plane, and the upper ends of the arranged components may be located on different planes that are parallel to each other.

For example, a unit pixel P may include at least three sub-pixels outputting light of different colors. For example, the unit pixel P may include three sub-pixels SP(R), SP(G), and SP(B), which respectively correspond to red (R), green (G) and blue (B). A red sub-pixel SP(R) may output red light, a green sub-pixel SP(G) may output green light, and a blue sub-pixel SP(B) may output blue light.

However, the pixel arrangement of FIG. 2 is merely an example that may be applied to the display module 10 and the display apparatus 1 according to one embodiment, and the sub-pixels may be arranged along a Z-axis direction, may not be arranged in a line, and may be implemented to have different sizes. In order to implement a plurality of colors, a single pixel only needs to include a plurality of sub-pixels, and there is no limitation on a size of each sub-pixel or an arrangement method of the sub-pixels.

Further, the unit pixel P is not necessarily composed of the red sub-pixel SP(R) configured to output red light, the green sub-pixel SP(G) configured to output green light, and the blue sub-pixel SP(B) configured to output blue light, and may include a sub-pixel configured to output yellow light or white light. That is, there is no limitation on the color or type of light output from each sub-pixel and the number of sub-pixels.

However, in the embodiment described below, for detailed description, the case in which the unit pixel P includes the red sub-pixel SP(R), the green sub-pixel SP(G), and the blue sub-pixel SP(B) will be described as an example.

As described above, each of the display module 10 and the display apparatus 1 according to one embodiment is a self-emitting display apparatus in which each pixel may emit light by itself. Accordingly, an inorganic light-emitting element that emits light of different colors may be disposed in each sub-pixel. For example, a red inorganic light-emitting element may be disposed in the red sub-pixel SP(R), a green inorganic light-emitting element may be disposed in the green sub-pixel SP(G), and a blue inorganic light-emitting element may be disposed in the blue sub-pixel SP(B).

Accordingly, in this embodiment, the pixel P may represent a cluster including the red inorganic light-emitting element, the green inorganic light-emitting element, and the blue inorganic light-emitting element, and the sub-pixel may represent each inorganic light-emitting element.

Figure 3:
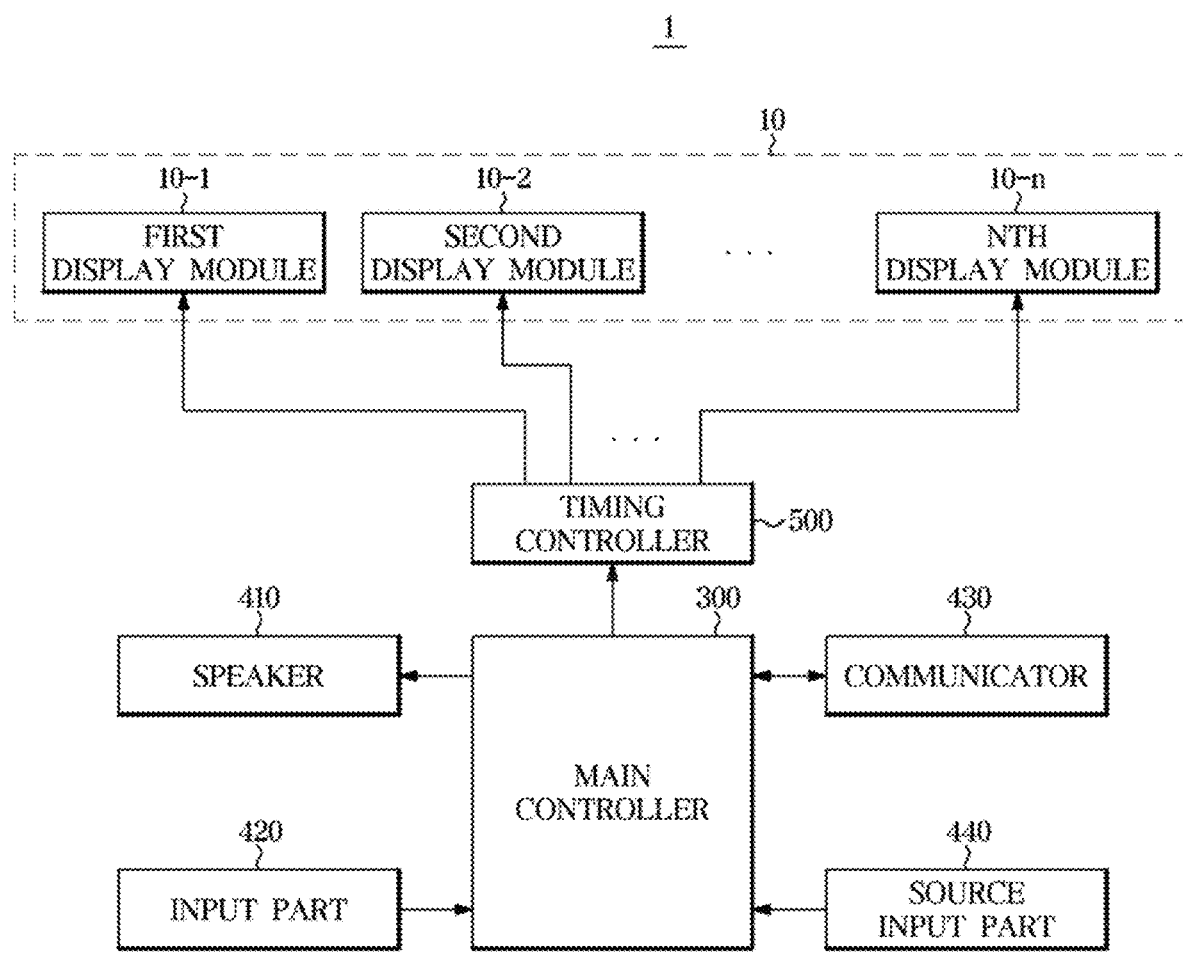
FIG. 3 is a diagram of a display apparatus according to an embodiment.

FIG. 3 is a diagram of a display apparatus according to an embodiment.

Referring to FIG. 3, as described above with reference to FIG. 1, the display apparatus 1 according to one embodiment may include a plurality of display modules 10-1, 10-2, . . . , and 10-n (where n is an integer greater than or equal to two), a main controller 300 and a timing controller 500 that are configured to control the plurality of display modules 10, a communicator 430 configured to communicate with an external device, a source input part 440 configured to receive a source image, a speaker 410 configured to output sound, and an input part 420 configured to receive a command for controlling the display apparatus 1 from a user.

The input part 420 may include a button or a touch pad provided in one region of the display apparatus 1, and when a display panel 11 (FIG. 4) is implemented as a touch screen, the input part 420 may include a touch pad provided on a front surface of the display panel 11. In addition, the input part 420 may also include a remote controller.

The input part 420 may receive various commands for controlling the display apparatus 1, such as power on/off, volume adjustment, channel adjustment, screen adjustment, various setting changes, or the like of the display apparatus 1, from the user.

The speaker 410 may be provided in one region of the housing 20, and a separate speaker module physically separated from the housing 20 may be further provided.

The communicator 430 may transmit and receive necessary data by performing communication with a relay server or other electronic devices. The communicator 430 may employ at least one of various wireless communication methods, such as 3rd Generation (3G), 4th Generation (4G), wireless local area network (LAN), Wi-Fi, Bluetooth, Zigbee, Wi-Fi Direct (WFD), ultra-wide band (UWB), infrared data association (IrDA), Bluetooth low energy (BLE), near field communication (NFC), and Z-wave. In addition, the communicator 430 may employ a wired communication method such as peripheral component interconnect (PCI), PCI-express, or universal serial bus (USB).

The source input part 440 may receive a source signal input from a set-top box, a USB, an antenna, and the like. Accordingly, the source input part 440 may include at least one selected from a source input interface group including a high-definition multimedia interface (HDMI) cable port, a USB port, an antenna, and the like.

The source signal received by the source input part 440 may be processed by the main controller 300 to be converted into a form that may be output by the display panel 11 and the speaker 410.

The main controller 300 and the timing controller 500 may include at least one memory, which is configured to store programs for performing operations described below and various types of data, and at least one processor configured to execute the stored programs.

The main controller 300 may process the source signal input through the source input part 440 to generate an image signal corresponding to the input source signal.

For example, the main controller 300 may include a source decoder, a scaler, an image enhancer, and a graphics processor. The source decoder may decode a source signal compressed in a format such as a Motion Picture Experts Group (MPEG) format, and the scaler may output image data of a desired resolution through resolution conversion.

The image enhancer may improve the image quality of the image data by applying various correction techniques. The graphics processor may classify pixel of the image data into RGB data and output a control signal such as a syncing signal for display timing in the display panel 11. That is, the main controller 300 may output image data, which corresponds to the source signal, and a control signal.

The above-described operation of the main controller 300 is merely an example applicable to the display apparatus 1, and of course, the main controller 300 may further perform other operations, or some of the operations described above may be omitted.

The image data and the control signal output from the main controller 300 may be transmitted to the timing controller 500.

The timing controller 500 may convert the image data transmitted from the main controller 300 into image data of a format that may be processed in a driver integrated circuit (IC) 200 (FIG. 4), and generate various control signals such as a timing control signal necessary for displaying the image data on the display panel 11.

The display apparatus 1 according to one embodiment does not need to include the plurality of display modules 10, but in the embodiment described below, for detailed description, the display apparatus 1 including the plurality of display modules 10 will be described as an example.

Figure 4:
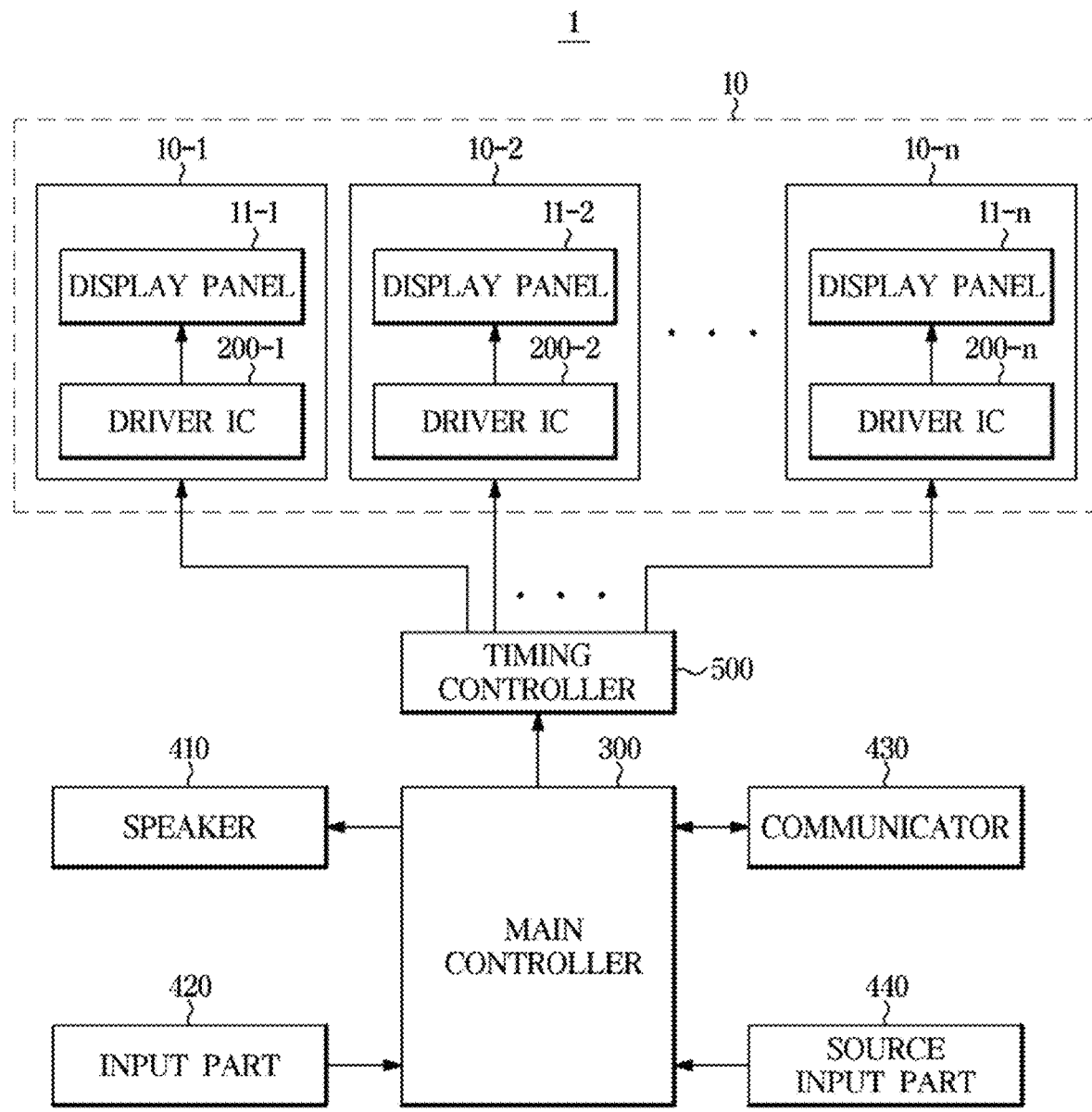
FIG. 4 is a diagram of a configuration of a display module included in the display apparatus according to an embodiment.
Figure 5:
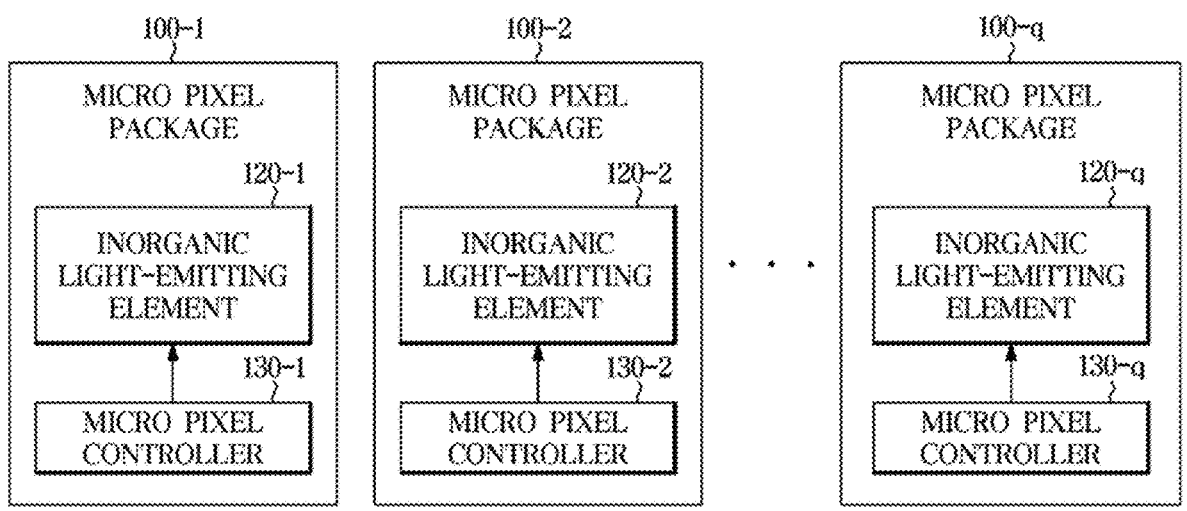
FIG. 5 is a diagram of a configuration of a display panel included in a display module according to an embodiment.
Figure 6:
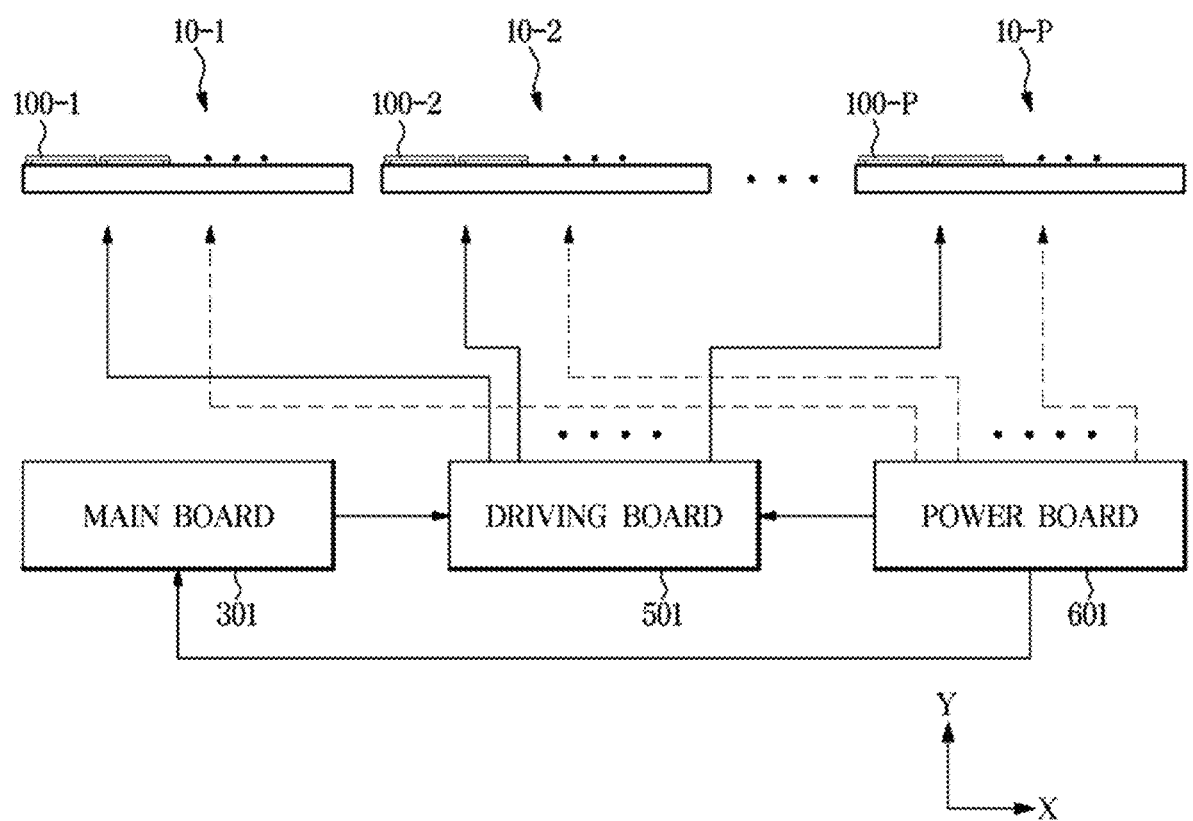
FIG. 6 is a diagram illustrating an example in which a signal is transmitted to a plurality of tiled display modules in a display apparatus according to an embodiment.

FIG. 4 is a diagram of a configuration of a display module included in the display apparatus according to an embodiment. FIG. 5 is a diagram of a configuration of a display panel included in a display module according to an embodiment. FIG. 6 is a diagram illustrating an example in which a signal is transmitted to a plurality of tiled display modules in a display apparatus according to an embodiment.

Referring to FIG. 4, each of the plurality of display modules 10-1, 10-2, . . . , and 10-*n* may include the display panels 11-1, 11-2, . . . , and 11-*n* configured to display an image and the driver ICs 200-1, 200-1, . . . , and 200-*n* are configured to drive the display panels 11-1, 11-2, . . . , and 11-*n*, respectively.

The driver ICs 200-1, 200-1, . . . , and 200-*n* may generate a driving signal based on the image data and the timing control signal transmitted from the timing controller 500 so that the display panels 11-1, 11-2, . . . , and 11-*n* display an image.

The driving signal generated by the driver ICs 200-1, 200-1, . . . , and 200-*n* may include a gate signal and a data signal, and the generated driving signal is input to the display panels 11-1, 11-2, . . . , and 11-*n*.

Referring to FIG. 5, a display panel 11 includes a plurality of micro pixel packages 100-1, 100-2, . . . , and 100-*q*, and each of the plurality of micro pixel packages 100-1, 100-2, . . . , and 100-*q* includes inorganic light-emitting elements 120-1, 120-2, . . . , and 120-*q* and micro pixel controllers 130-1, 130-2, . . . , 130-*q*, respectively. In this embodiment, it is described that three or more micro pixel packages 100-1, 100-2, . . . , and 100-*q* are provided, but the embodiment of the display module 10 is not limited thereto. As long as a plurality of micro pixel packages 100-1, 100-2, . . . , and 100-*q* are provided (q is an integer greater than or equal to two), there is no limitation on the number of the micro pixel packages 100.

The display panel 11 may include a plurality of pixels arranged two dimensionally as described above, and each of the pixels may include a plurality of sub-pixels to implement various colors.

Further, as described above, the display apparatus 1 according to one embodiment is a self-emitting display apparatus in which each pixel may emit light by itself. Accordingly, the inorganic light-emitting elements 120-1, 120-2, . . . , and 120-*q* may be disposed in each sub-pixel. That is, each of the plurality of pixels may include two or more inorganic light-emitting elements 120-1, 120-2, . . . , and 120-*q*.

Each of the inorganic light-emitting elements 120-1, 120-2, . . . , and 120-*q* may be driven by an active matrix (AM) method or a passive matrix (PM) method, but in the embodiment described below, for detailed description, a case in which the inorganic light-emitting elements 120-1, 120-2, . . . , and 120-*q* are driven by the AM method will be described as an example.

In the display module 10 according to one embodiment, each inorganic light-emitting element 120-1, 120-2, . . . , and 120-*q* may be individually controlled by the micro pixel controllers 130-1, 130-2, . . . , 130-*q*, respectively, and the micro pixel controllers 130-1, 130-2, . . . , 130-*q* may operate in response to the driving signal output from the driver IC 200.

The micro pixel packages 100-1, 100-2, . . . , and 100-*q* may be arranged in rows and columns on a module substrate of the display module 10. That is, the micro pixel packages 100-1, 100-2, . . . , and 100-*q* may have a two-dimensional array which is composed of a plurality of rows and a plurality of columns. In this case, each of the plurality of micro pixel packages 100-1, 100-2, . . . , and 100-*q* may be electrically connected to the micro pixel packages 100 that are disposed in the rows adjacent thereto while being disposed in the same column.

In this embodiment, when it is described that some components are disposed in the same column, this may include not only a case in which the components are disposed in columns that are numerically perfectly matched but also a case in which the components are disposed in columns that match each other within a predetermined error range. In addition, in this embodiment, when it is described that some components are disposed in the same row, this may include not only a case in which the components are disposed in rows that are numerically perfectly matched but also a case in which the components are disposed in rows that match each other within a predetermined error range.

In other words, the plurality of micro pixel packages 100-1, 100-2, . . . , and 100-*q* may be arranged two dimensionally on the module substrate (a first substrate described below) of the display module 10, and each of the plurality of micro pixel packages 100-1, 100-2, . . . , and 100-*q* may be electrically connected to the micro pixel controller adjacent thereto in a first direction. The first direction may correspond to, for example, a column direction (i.e., the Z-axis direction).

Referring to FIG. 6, the plurality of display modules 10-1, 10-2, . . . , and 10-*n* may be electrically connected to a driving board 501. For example, the display panel 11 may be connected to a flexible printed circuit board (FPCB) through a film on which the driver IC 200 is mounted. The FPCB may be connected to the driving board 501 to electrically connect the display module 10 to the driving board 501.

The timing controller 500 may be provided on the driving board 501. Accordingly, the driving board 501 may be referred to as a T-con board. The plurality of display modules 10-1, 10-2, . . . , and 10-*n* may receive image data, a timing control signal, and the like from the driving board 501.

Further, the display apparatus 1 may further include a main board 301 and a power board 601. The above-described main controller 300 may be provided on the main board 301, and a power supply circuit may be provided on the power board 601 to supply power to the plurality of display modules 10-1, 10-2, . . . , and 10-*n*.

The power board 601 may be electrically connected to the plurality of display modules 10-1, 10-2, . . . , and 10-*n* through the FPCB, and may supply a power supply voltage $V_{DD}$, a reference voltage $V_{SS}$, and the like to the plurality of display modules 10-1, 10-2, . . . , and 10-*n* that are connected through the FPCB.

For example, the power supply voltage $V_{DD}$ and the reference voltage $V_{SS}$ supplied from the power board 601 may be applied to the micro pixel packages 100 disposed on the module substrate through lines of the module substrate. The power supply voltage $V_{DD}$ and the reference voltage $V_{SS}$ supplied from the power board 601 may be applied to the micro pixel packages 100-1, 100-2, . . . , and 100-P arranged in a first row.

At this point, the micro pixel packages 100-1, 100-2, . . . , and 100-P arranged in the rows other than the first row may receive a voltage from the micro pixel packages of a previous row and transmit the input voltage to the micro pixel packages of a next row.

Specifically, each of the plurality of micro pixel packages 100-1, 100-2, . . . , and 100-P may be electrically connected to micro pixel packages which are disposed in the same column and disposed in adjacent rows, through voltage lines disposed on the module substrate.

In this case, each of the plurality of micro pixel packages 100-1, 100-2, . . . , and 100-P may include internal connection lines that electrically connect between voltage lines electrically connected to the micro pixel package of a previous row and voltage lines electrically connected to the micro pixel package of a next row.

That is, the voltages $V_{DD}$ and $V_{SS}$ supplied from the power board 601 may be input to the micro pixel packages 100-1, 100-2, . . . , and 100-P through the voltage lines, which are provided on the module substrate and connected to the micro pixel package of a previous row, and may be output to the voltage lines, which are provided on the module substrate and connected to the micro pixel package of a next row, through the internal connection lines provided in the micro pixel packages 100-1, 100-2, . . . , and 100-P.

In this case, the internal connection line provided in the micro pixel packages 100-1, 100-2, . . . , and 100-P has improved line resistance as compared with the voltage line provided on the module substrate so that electron mobility may be increased. Specifically, when the line is mounted in the micro pixel package, process difficulty may be reduced as compared with when the line is mounted on the module substrate. Accordingly, the internal connection line provided in the micro pixel package may be mounted to be thicker than the voltage line provided on the module substrate, and thus electron mobility may be increased.

In other words, each of the plurality of micro pixel packages 100-1, 100-2, . . . , and 100-P may be electrically connected to the micro pixel package adjacent thereto in the first direction through the voltage lines provided on the module substrate, and may include the internal connection lines electrically connecting the voltage lines electrically connected to one of the micro pixel packages adjacent thereto in the first direction and the voltage lines electrically connected to another one of the micro pixel packages adjacent thereto in the first direction. Each of the plurality of micro pixel packages 100-1, 100-2, . . . , and 100-P may transmit a voltage input from one of the micro pixel packages, which is electrically connected thereto through the internal connection lines, to another one of the micro pixel packages, which is electrically connected thereto.

As such, in the display module 10 of the present disclosure, the voltage lines that electrically connect between the micro pixel packages 100-1, 100-2, . . . , and 100-P are disposed on the module substrate, and the internal connection lines that electrically connect between the voltage lines are disposed inside the micro pixel package so that some of the power lines are provided in the micro pixel package.

In the display module 10, through the internal connection line inside the micro pixel packages 100-1, 100-2, . . . , and 100-P, it is possible to reduce a rate at which the voltage passes through the voltage line of the module substrate, which has low electron mobility, and a current-resistance (IR) drop of the voltage may be minimized as compared to when the voltage is supplied to the micro pixel packages 100-1, 100-2, . . . , and 100-P through only the voltage line on the module substrate.

Thus, the display module 10 allows the plurality of micro pixel controllers micro pixel controllers 130-1, 130-2, . . . , 130-q to be driven with the same voltage regardless of a distance from the power board 601, thereby preventing the IR drop that may occur according to the distance from the power board 601. Voltage transmission between the micro pixel packages 100-1, 100-2, . . . , and 100-P will be described in detail below.

In the above-described example, the plurality of display modules 10-1, 10-2, . . . , and 10-n are described as sharing the driving board 501 and the power board 601, but it is also possible that a separate driving board 501 and a separate power board 601 are connected to each individual display module. Alternatively, it is also possible that the plurality of display modules 10-1, 10-2, . . . , and 10-n are grouped and one driving board 501 and one power board 601 are connected to each group.

FIG. 6 is a diagram illustrating the display apparatus 1 on an XY plane and thus illustrates only one-dimensional arrangement of the display modules 10-1, 10-2, . . . , and 10-n. However, of course, the plurality of display modules 10-1, 10-2, . . . , and 10-n may also be arranged two dimensionally as described above with reference to FIG. 1.

Figure 7:
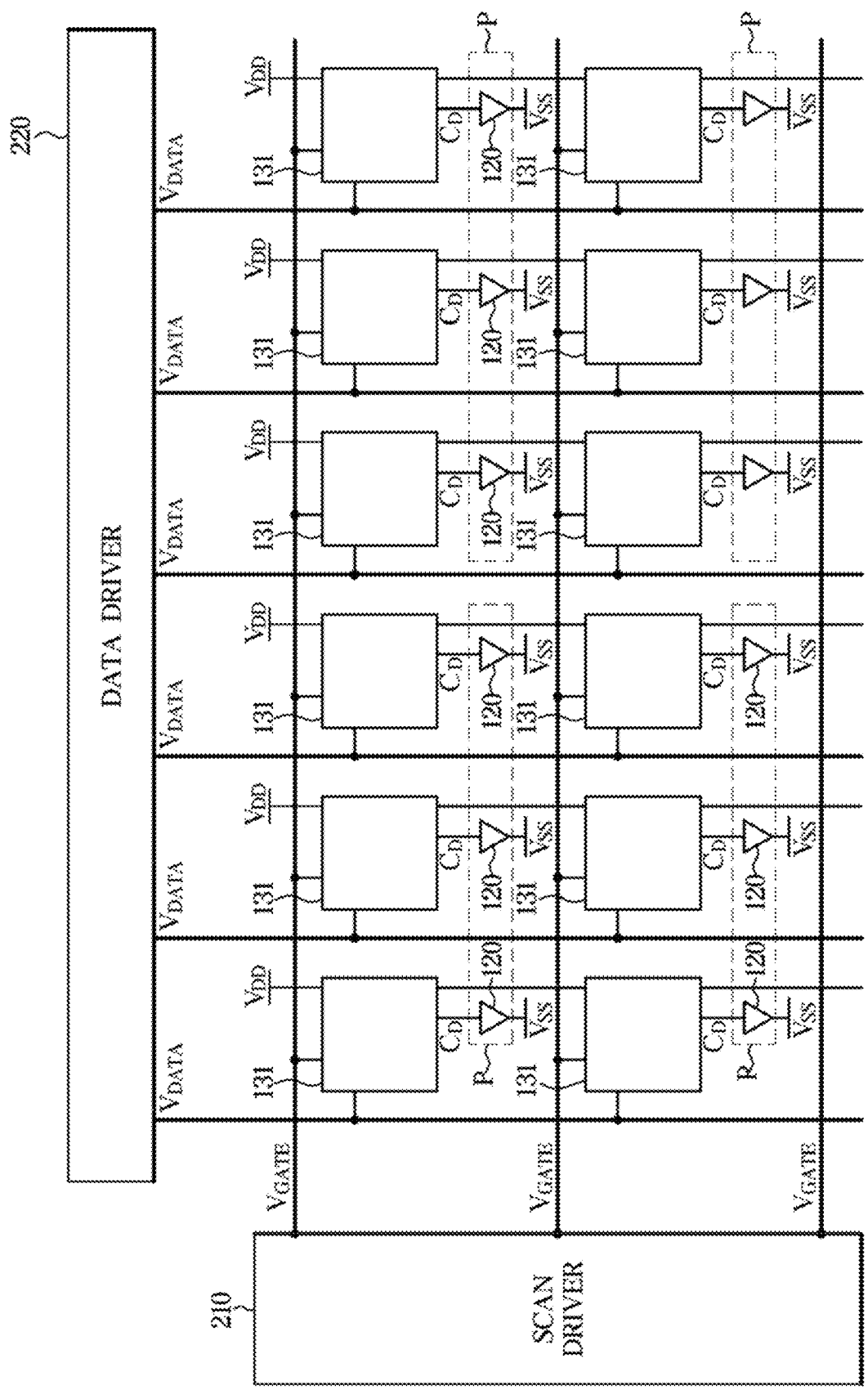
FIG. 7 is a diagram for a method of driving each pixel in a display module according to an embodiment.
Figure 8:
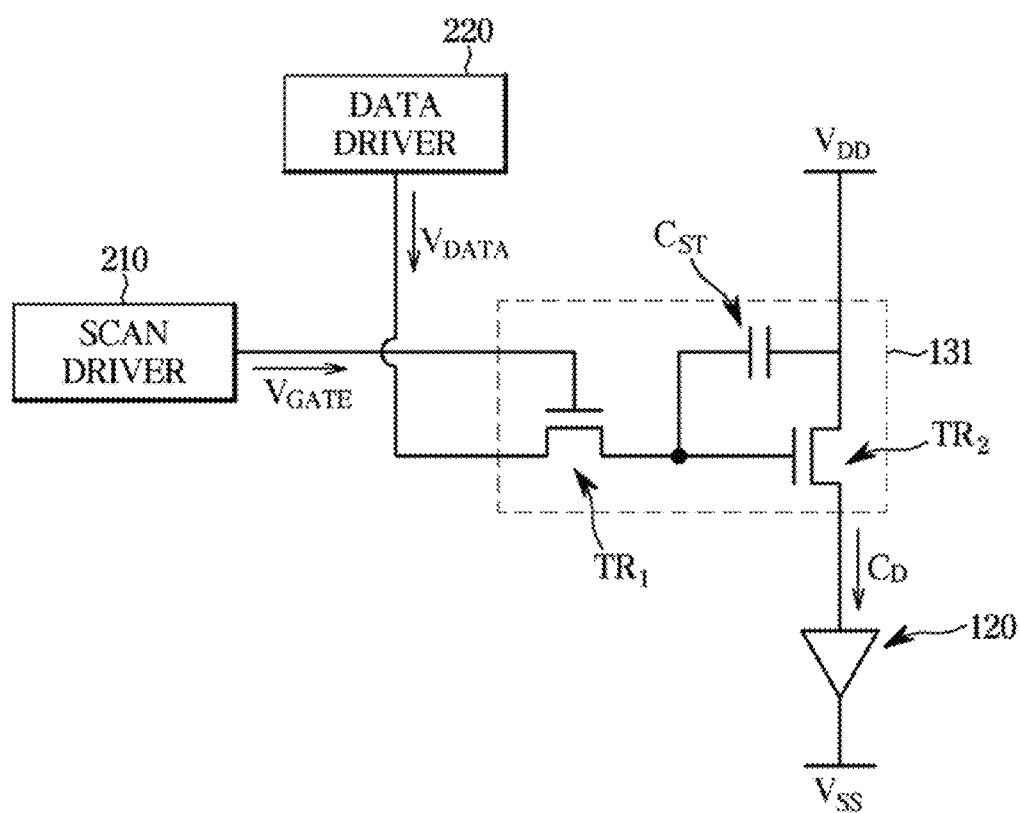
FIG. 8 is a diagram illustrating a pixel circuit configured to control a single sub-pixel in a display module according to an embodiment.
Figure 9:
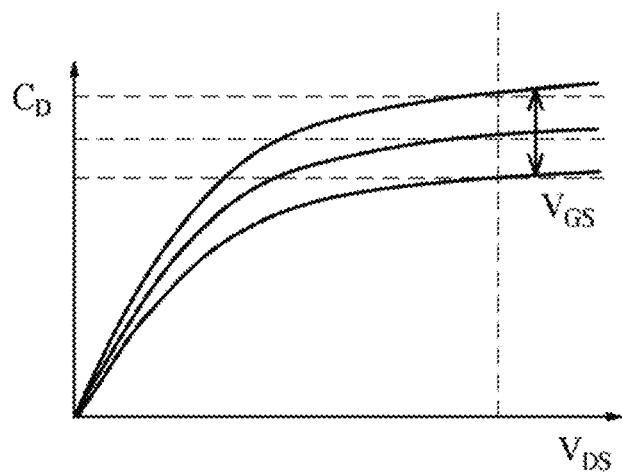
FIGS. 9 and 10 are graphs illustrating a variation of a driving current according to a power supply voltage or a reference voltage in a pixel circuit according to an embodiment.
Figure 10:
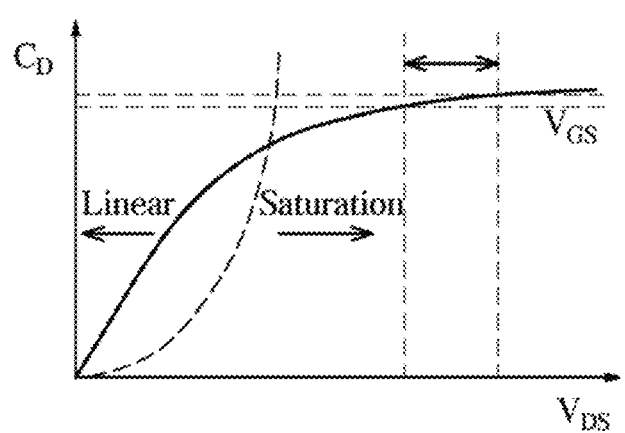

FIG. 7 is a diagram for a method of driving each pixel in a display module according to an embodiment. FIG. 8 is a diagram illustrating a pixel circuit configured to control a single sub-pixel in a display module according to an embodiment. FIGS. 9 and 10 are graphs illustrating a variation of a driving current according to a power supply voltage or a reference voltage in a pixel circuit according to an embodiment.

Referring to FIG. 7, the driver IC 200 may include a scan driver 210 and a data driver 220. The scan driver 210 may output a gate signal for turning the sub-pixel on/off, and the data driver 220 may output a data signal for implementing an image. However, according to various design changes, some of the operations of the driver IC 200 may be performed by the micro pixel controller 130. For example, the operation of the scan driver 210 may be performed by the micro pixel controller 130, and in this case, the driver IC 200 may not include the scan driver 210. In the embodiment described below, for detailed description, the case in which the driver IC 200 includes both the scan driver 210 and the data driver 220 will be described as an example.

The scan driver 210 may generate the gate signal based on the control signal transmitted from the timing controller 500, and the data driver 220 may generate the data signal based on the image data transmitted from the timing controller 500.

The micro pixel controller 130 may include a pixel circuit 131 for individually controlling each inorganic light-emitting element 120, and the gate signal output from the scan driver 210 and the data signal output from the data driver 220 may be input to the pixel circuit 131.

For example, when a gate voltage $V_{GATE}$, a data voltage $V_{DATA}$, and the power supply voltage $V_{DD}$ are input to the pixel circuit 131, the pixel circuit 131 may output a driving current $C_D$ for driving the inorganic light-emitting element 120.

The driving current $C_D$ output from the pixel circuit 131 may be input to the inorganic light-emitting element 120, and the inorganic light-emitting element 120 may emit light due to the input driving current $C_D$ to implement an image.

As described above, according to the embodiment, each of the micro pixel controllers 130 may be electrically connected to the timing controller 500 to receive the gate signal, and may control the pixel circuit 131 by processing the transmitted gate signal, thereby outputting the driving current $C_D$. In this case, the scan driver 210 may be omitted.

Referring to the example of FIG. 8, the pixel circuit 131 may include thin-film transistors $TR_1$ and $TR_2$ configured to switch or drive the inorganic light-emitting element 120 and a capacitor $C_{ST}$. As described above, the inorganic light-emitting element 120 may be a micro-LED.

For example, the thin-film transistors $TR_1$ and $TR_2$ may include a switching transistor $TR_1$ and a driving transistor $TR_2$, and the switching transistor $TR_1$ and the driving transistor $TR_2$ may be P-type metal oxide semiconductor (PMOS) type transistors. However, the embodiment of the display module 10 and the display apparatus 1 is not limited thereto, and the switching transistor $TR_1$ and the driving transistor $TR_2$ may be N-type metal oxide semiconductor (NMOS) type transistors.

The switching transistor $TR_1$ has a gate electrode connected to the scan driver 210, a source electrode connected to the data driver 220, and a drain electrode connected to one end of the capacitor $C_{ST}$ and a gate electrode of the driving transistor $TR_2$. The power supply voltage $V_{DD}$ may be applied to the other end of the capacitor $C_{ST}$.

In addition, the power supply voltage $V_{DD}$ may be applied to a source electrode of the driving transistor $TR_2$, and a drain electrode of the driving transistor $TR_2$ may be connected to an anode of the inorganic light-emitting element 120. The reference voltage $V_{SS}$ may be supplied to a cathode of the inorganic light-emitting element 120. The reference voltage $V_{SS}$ may be a voltage lower than the power supply voltage $V_{DD}$, and a ground voltage or the like may be used as the reference voltage $V_{SS}$ to provide the ground.

The pixel circuit 131 of the above-described structure may operate as described below. First, when the gate voltage VGATE is applied from the scan driver 210 to turn the switching transistor $TR_1$ on, the data voltage $V_{DATA}$ applied from the data driver 220 may be transmitted to one end of the capacitor $C_{ST}$ and the gate electrode of the driving transistor $TR_2$.

A voltage corresponding to a gate-source voltage $V_{GS}$ of the driving transistor $TR_2$ may be maintained for a predetermined time due to the capacitor $C_{ST}$. The driving transistor $TR_2$ may apply the driving current $C_D$ corresponding to the gate-source voltage $V_{GS}$ to the anode of the inorganic light-emitting element 120, thereby causing the inorganic light-emitting element 120 to emit light.

At this point, when the data voltage $V_{DATA}$ with a high level is transmitted to the gate electrode of the driving transistor $TR_2$, the gate-source voltage $V_{GS}$ of the driving transistor $TR_2$ is lowered, and thus a small amount of driving current $C_D$ may be applied to the inorganic light-emitting element 120 so that the inorganic light-emitting element 120 may display a low grayscale.

On the other hand, when the data voltage $V_{DATA}$ with a low level is transmitted, the gate-source voltage $V_{GS}$ of the driving transistor $TR_2$ is increased, and thus a large amount of driving current $C_D$ is applied to the inorganic light-emitting element 120 so that the inorganic light-emitting element 120 may display a high grayscale.

However, the above-described structure of the pixel circuit 131 is merely an example applicable to the display module 10 according to one embodiment, and various circuit structures for switching and driving the plurality of inorganic light-emitting elements 120 may be applied to the display module 10 in addition to the above example.

Further, in this embodiment, a brightness control method of the inorganic light-emitting element 120 is not limited. The brightness of the inorganic light-emitting element 120 may be controlled by one of various methods, such as a pulse amplitude modulation (PAM) method, a pulse width modulation (PWM) method, and a hybrid method combining the PAM method and the PWM method.

In this case, as shown in FIG. 9, when the power supply voltage $V_{DD}$ applied to the pixel circuit 131 of the micro pixel controller 130 changes, the gate-source voltage $V_{GS}$ of the driving transistor $TR_2$ may be changed so that the driving current $C_D$ supplied to the inorganic light-emitting element 120 may be changed.

In addition, as shown in FIG. 10, when the power supply voltage $V_{DD}$ applied to the pixel circuit 131 of the micro pixel controller 130 or the reference voltage $V_{SS}$ applied to the inorganic light-emitting element 120 changes, a drain-source voltage VDS of the driving transistor $TR_2$ is changed so that the driving current $C_D$ supplied to the inorganic light-emitting element 120 may be changed even in a saturation region.

As such, when the power supply voltage $V_{DD}$ and the reference voltage $V_{SS}$ applied to the micro pixel controller 130 and the inorganic light-emitting element 120 change, the driving current $C_D$ corresponding to the input data voltage $V_{DATA}$ is not supplied to the inorganic light-emitting element 120, and thus required luminance may not be provided, and accordingly, Mura effects or color conversion may occur.

When each of the micro pixel controllers 130 and the inorganic light-emitting elements 120 is electrically connected to the power board 601 to receive the power supply voltage $V_{DD}$ and the reference voltage $V_{SS}$, a magnitude of each of the power supply voltage $V_{DD}$ and the reference voltage $V_{SS}$ may vary depending on a difference in line length.

For example, the further the micro pixel controller 130 is from the power board 601, the longer the line may be, and the magnitude of the supplied power supply voltage $V_{DD}$ may be reduced due to an IR drop caused by self-resistance of the line. Accordingly, as the distance from the power board 601 increases, the luminance of the pixel controlled by the micro pixel controller 130 may be reduced.

Accordingly, in the display apparatus 1 of the present disclosure, some of the power lines may be formed in the micro pixel package 100 or the micro pixel controller 130 so that the IR drop of each of the power supply voltage $V_{DD}$ and the reference voltage $V_{SS}$ supplied to each of the plurality of micro pixel controllers 130 disposed in the display module 10 may be minimized.

Hereinafter, the case in which some of the power lines are formed in the micro pixel package 100 or the micro pixel controller 130 will be described in more detail.

Figure 11:
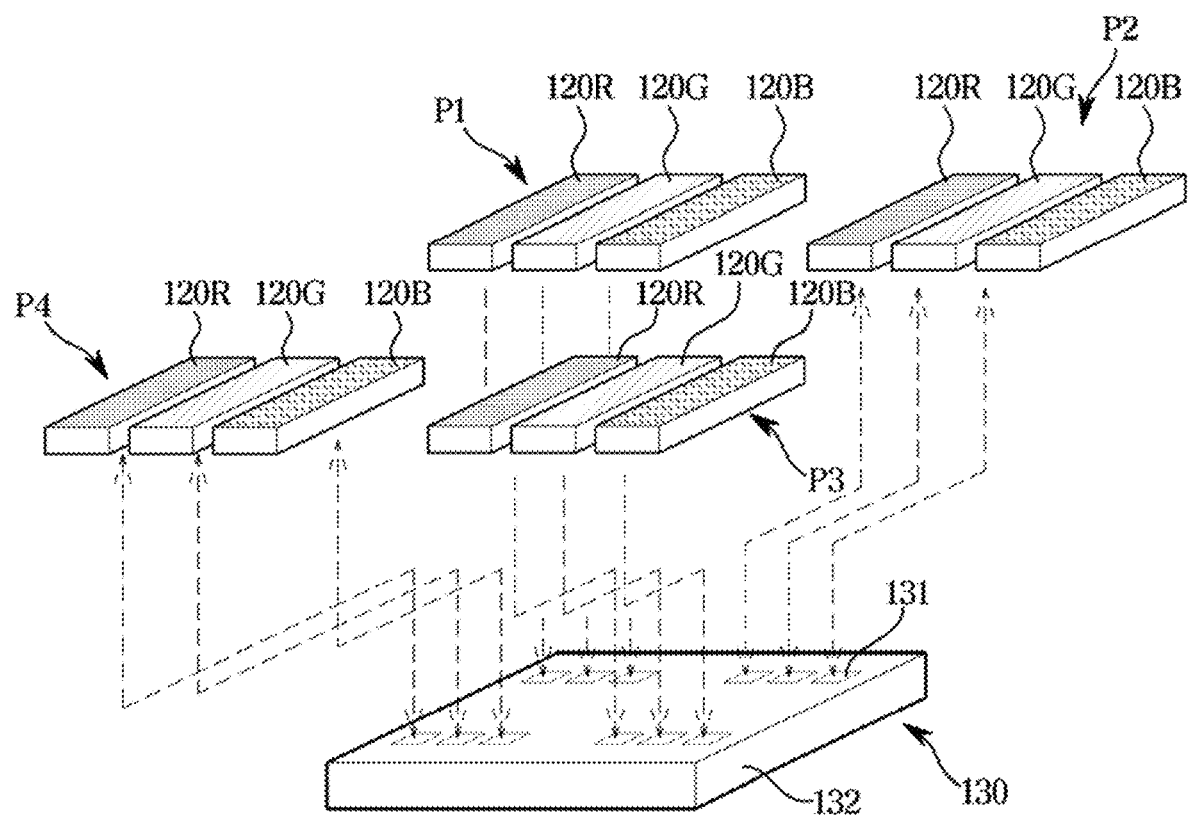
FIG. 11 is a diagram illustrating a relationship between a micro pixel controller and pixels controlled by a micro pixel controller in a display module according to an embodiment.

FIG. 11 is a diagram illustrating a relationship between a micro pixel controller and pixels controlled by a micro pixel controller in a display module according to an embodiment.

Referring to FIG. 11, one micro pixel controller 130 may control four pixels P1, P2, P3, and P4. Controlling the pixel may refer to controlling the plurality of inorganic light-emitting elements 120 constituting the pixel.

To this end, a plurality of pixel circuits 131 for respectively controlling the inorganic light-emitting elements 120 constituting each of the four pixels P1, P2, P3, and P4 may be provided on a micro substrate 132 of the micro pixel controller 130. In the embodiment described below, the micro substrate 132 is referred to as a third substrate 132 to distinguish the micro substrate 132 from a module substrate 13 (FIG. 14) and a package substrate 110 (FIG. 12).

In this case, the pixel circuit 131 may include at least one thin-film transistor for switching the plurality of inorganic light-emitting elements 120 constituting the pixel and supplying the driving current $C_D$ to the plurality of inorganic light-emitting elements 120 constituting the pixel.

In other words, the micro pixel controller 130 may include at least one thin-film transistor disposed on the third substrate 132 to switch the plurality of inorganic light-emitting elements 120 constituting two or more pixels, and to supply the driving current $C_D$ to the plurality of inorganic light-emitting elements 120 constituting the two or more pixels.

However, there is no limitation on the number of pixels that may be controlled by one micro pixel controller 130, and in the following description, for convenience of description, the case in which one micro pixel controller 130 controls four pixels P1, P2, P3, and P4 will be described. As an example, one micro pixel controller 130 may control pixels disposed in a 2Xn array or an nX2 array (where n is an integer greater than or equal to one), and in the following description, a case in which one micro pixel controller 130 controls four pixels P1, P2, P3, and P4 disposed in a 2×2 array will be described.

As many pixel circuits 131 as the number of the inorganic light-emitting elements 120 controlled by the micro pixel controller 130 may be provided, and it is also possible to implement a case of one pixel circuit 131 controlling two or more inorganic light-emitting elements 120.

The third substrate 132 may be implemented as one of substrates of various materials such as a silicon substrate, a glass substrate, a plastic substrate, a PCB, an FPCB, and a cavity substrate. Since there is no heat source such as the inorganic light-emitting element in the micro pixel controller 130, the type of substrate may be selected without limitation according to the heat resistance of the material.

The thin-film transistor (TFT) formed on the third substrate 132 may be a low-temperature polycrystalline silicon (LTPS) TFT or an oxide TFT. In addition, the TFT may also be an amorphous silicon (a-Si) TFT or a single crystal TFT. However, in this embodiment, for detailed description, a case in which the TFT is an LTPS TFT will be described as an example.

As described above, the third substrate 132 may be implemented as a silicon substrate. The silicon substrate does not have restrictions on electron mobility as compared with the glass substrate, and thus when the third substrate 132 is implemented as the silicon substrate, the performance of the LTPS TFT may be improved.

According to the embodiment of the display module 10, circuit inspection may be performed individually for each micro pixel controller 130, and only the micro pixel controller 130 determined as a good product by the circuit inspection may be mounted in the display module 10. Accordingly, in comparison with a case in which the TFT circuit is directly mounted on the module substrate (the first substrate described below), the circuit may be easily inspected and a defective product may be easily replaced.

Figure 13:
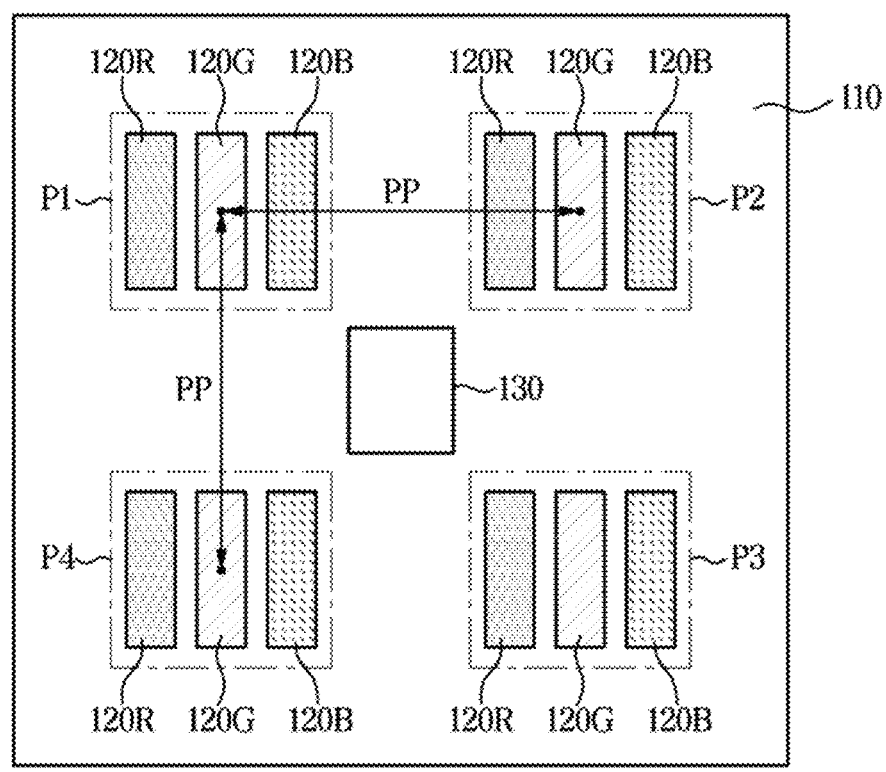
FIG. 13 is a diagram illustrating an upper surface of a micro pixel package included in a display module according to an embodiment.
Figure 14:
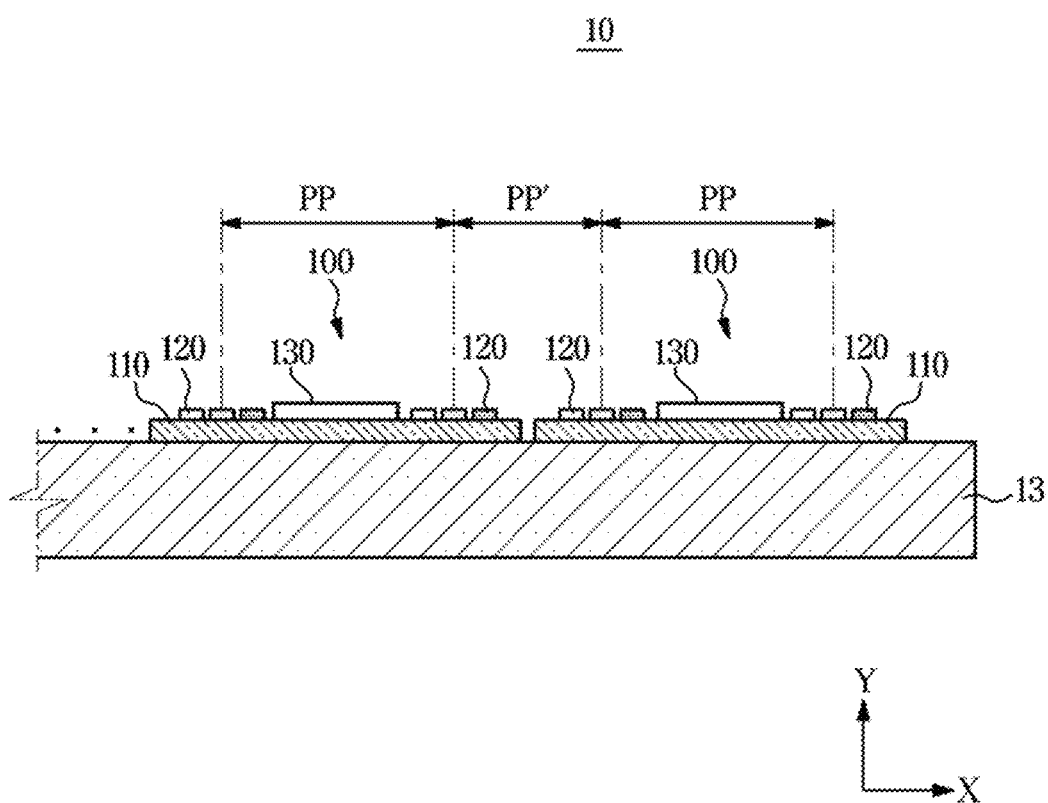
FIG. 14 is a diagram of a module substrate on which a micro pixel package is disposed, in a display module according to an embodiment.
Figure 15:
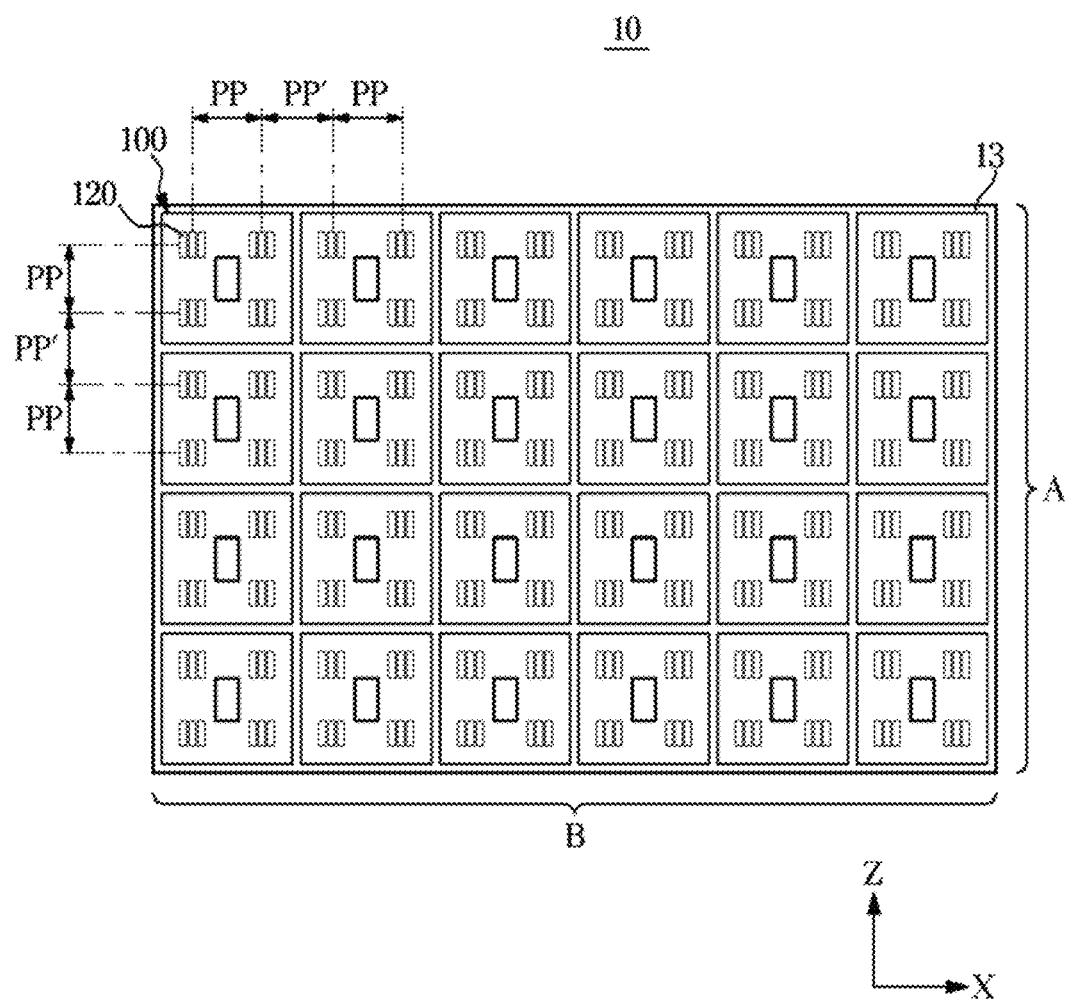
FIG. 15 is a diagram illustrating an upper surface of a module substrate on which a micro pixel package is disposed, in a display module according to an embodiment.

FIG. 12 is a side cross-sectional view of a micro pixel package included in the display module according to an embodiment. FIG. 13 is a diagram illustrating an upper surface of a micro pixel package included in a display module according to an embodiment. FIG. 14 is a diagram of a module substrate on which a micro pixel package is disposed, in a display module according to an embodiment. FIG. 15 is a diagram illustrating an upper surface of a module substrate on which a micro pixel package is disposed, in a display module according to an embodiment.

Referring to FIG. 12, the plurality of inorganic light-emitting elements 120 (e.g., 120R, 120G, 120B) and at least one micro pixel controller 130 may be provided in one micro pixel package 100.

The plurality of inorganic light-emitting elements 120 may be disposed on an upper surface of the package substrate 110 of one micro pixel package 100, and at least one micro pixel controller 130 may be disposed on the package substrate 110. In the embodiment described below, the package substrate 110 is referred to as a second substrate 110 to distinguish the package substrate 110 from other substrates.

In the embodiment of the display module 10 and the display apparatus 1, there is no limitation on the number of the micro pixel controllers 130 included in one micro pixel package 100. For example, when it is assumed that one micro pixel controller 130 controls four pixels, in one micro pixel package 100, four pixels and one micro pixel controller 130 that controls the four pixels may be provided as in the example of FIGS. 12 and 13, eight pixels and two micro pixel controllers 130 that control the eight pixels may be provided, twelve pixels and three micro pixel controllers 130 that control the twelve pixels may be provided, or sixteen pixels and four micro pixel controllers 130 that control the sixteen pixels may be provided. In the following description, for convenience of description, the case in which four pixels and one micro pixel controller 130 that control the four pixels are provided in one micro pixel package 100 will be described as an example.

The plurality of inorganic light-emitting elements 120 and at least one micro pixel controller 130 may be electrically connected to the second substrate 110.

The second substrate 110 may be implemented as one of substrates of various materials such as a silicon substrate, a glass substrate, a plastic substrate, a PCB, an FPCB, and a cavity substrate. Although the type of second substrate 110 is not limited, in the embodiment described below, for detailed description, a case in which the second substrate 110 is implemented as the glass substrate will be described as an example.

In this embodiment, the inorganic light-emitting element 120 may have a flip chip structure in which a pair of electrodes are disposed on a surface opposite to a light-emitting surface of the diode.

The pair of electrodes may include an anode and a cathode. As an example, the anode and the cathode may be provided at both ends of the inorganic light-emitting element 120 in a length direction (longitudinal direction).

The inorganic light-emitting element 120 is disposed such that the light-emitting surface faces upward (+Y direction), and an electrode provided on an opposite surface of the light-emitting surface may be electrically connected to an upper electrode pad provided on the upper surface of the second substrate 110.

In this embodiment, when it is described that two components are electrically connected, this may include not only a case in which conductive materials through which electricity flows are directly soldered between the two components, but also a case in which the two components are connected through separate lines or a case in which a conductive adhesive is used between the two components. There is no restriction on a specific connection method as long as current flows between two connected components.

For example, when the soldering is performed on the two components, gold-indium (Au—In) bonding, gold-tin (Au—Sn) bonding, copper (Cu) pillar/tin-silver (SnAg) bump bonding, and nickel (Ni) pillar/SnAg bump bonding, solder ball bonding using tin-silver-copper (SnAgCu), tin-bismuth (SnBi), or SnAg, and the like may be used.

In addition, when the conductive adhesive is used, a conductive adhesive, such as an anisotropic conductive film (ACF) and an anisotropic conductive paste (ACP), may be disposed between the two components, and pressure is applied to allow current to flow in a direction in which the pressure is applied.

As described above, the pixel circuit 131 for switching and driving the inorganic light-emitting element 120 may be provided on the separate third substrate 132 rather than on the second substrate 110 to constitute the micro pixel controller 130.

The third substrate 132 may be provided with a connection pin for electrical connection with the second substrate 110, and the connection pin may be electrically connected to the electrode pad provided on the second substrate 110.

According to the embodiment of the display module 10, since circuit elements such as a TFT for switching and driving the plurality of inorganic light-emitting elements 120 are provided in the separate micro pixel controller 130 rather than on the second substrate 110, the circuit elements such as a TFT other than electrode pads and lines do not have to be formed on the second substrate 110. Thus, the second substrate 110 may be implemented as a glass substrate having excellent durability against the heat of the inorganic light-emitting element 120, and even when the second substrate 110 is implemented as the glass substrate, this may not affect the performance of the TFT.

Further, damage to the circuit element may be prevented in a process of cutting the second substrate 110 or the module substrate (the first substrate described below) and forming lines or in a process of replacing the inorganic light-emitting element 120, and process difficulty in manufacturing the display module 10 may be reduced.

Further, according to the embodiment of the display module 10, since circuit elements such as a TFT for switching and driving the plurality of inorganic light-emitting elements 120 are provided in the separate micro pixel controller 130 rather than on the module substrate (the first substrate described below), a plurality of metal lines required to mount the circuit elements on the module substrate may be reduced, and thus, the problem of an IR drop due to interference between the plurality of metal lines may be solved. In other words, in the display module 10 of the present disclosure, in comparison with a case in which circuit elements are directly mounted on the module substrate, lines on the module substrate may be reduced, so that the problem of an IR drop due to interference between the lines may be solved.

Referring to FIG. 13, the micro pixel controller 130 may be disposed on the upper surface of the second substrate 110 and may be disposed at a center portion of a space between the pixels P1, P2, P3, and P4 to be controlled. In this case, the micro pixel controller 130 may be electrically connected to an anode of each of the pixels P, which are to be controlled, through an anode line, and may be electrically connected to a cathode of each of the pixels P, which are to be controlled, through a cathode line.

However, depending on the embodiment, the micro pixel controller 130 may not be disposed at the center portion of the space between the pixels P1, P2, P3, and P4, and may be disposed without limitation as long as the micro pixel controller 130 is electrically connected to the pixels P to be controlled. For example, the micro pixel controller 130 may be disposed at a location corresponding to a pixel region of each of the four pixels P1, P2, P3, and P4 controlled by the micro pixel controller 130. In this embodiment, the pixel region is a region in which each pixel is located, and when an active region of the display panel 11 is partitioned into the same array (MXN) as the array of pixels, a region including each pixel may be defined as a pixel region of the corresponding pixel. As a more specific example, the micro pixel controller 130 may be disposed in one region in which the pixel regions of the four pixels P1, P2, P3, and P4 controlled by the micro pixel controller 130 are combined, that is, an entire pixel region PW. The micro pixel controller 130 may be disposed at a location corresponding to a center portion of the entire pixel region PW.

In addition, the micro pixel controller 130 may be disposed on a lower surface of the second substrate 110 rather than the upper surface of the second substrate 110 according to the embodiment, and in this case, the micro pixel controller 130 may be electrically connected to the pixels P, which are to be controlled, through via hole lines. Hereinafter, for convenience of description, the case in which the micro pixel controller 130 is disposed on the upper surface of the second substrate 110 will be described as an example.

In this case, distances between adjacent pixels of the plurality of pixels included in the display module 10 may all be the same. In this embodiment, when it is described that certain values are the same, this may include not only a case in which the corresponding values are completely the same but also a case in which the corresponding values are the same within a predetermined error range.

That is, pixel intervals PP between the pixels P1, P2, P3, and P4 to be controlled by one micro pixel controller 130 may be equal to each other. As shown in FIG. 13, the pixel intervals PP between adjacent pixels of the pixels P1, P2, P3, and P4 disposed in one micro pixel package 100 may be the same. For example, among the pixels P1, P2, P3, and P4 disposed on the upper surface of the second substrate 110, an interval between a first pixel P1 and a second pixel P2 may be the same as an interval between the first pixel P1 and a fourth pixel P4.

The micro pixel package 100 may be disposed on the upper surface of the module substrate 13 as shown in FIGS. 14 and 15. In the embodiment described below, the module substrate is referred to as the first substrate.

The first substrate 13 may be implemented as one of substrates of various materials such as a silicon substrate, a glass substrate, a plastic substrate, a PCB, an FPCB, and a cavity substrate. Since the inorganic light-emitting element 120 or the TFT circuit is not directly mounted on the first substrate 13, the type of first substrate 13 may be selected in consideration of the ease, efficiency, cost, and the like of a manufacturing process.

As described above, since the plurality of inorganic light-emitting elements 120 are disposed on the upper surface of the second substrate 110 of the micro pixel package 100, the micro pixel package 100 may be disposed such that the lower surface of the second substrate 110 faces the first substrate 13 and the upper surface of second substrate 110 faces upward (+Y direction).

In addition, the micro pixel package 100 may be disposed in consideration of pixel pitches and the entire pixel array of the display module 10. For example, when the display module 10 has a pixel array of an M×N matrix, and the inorganic light-emitting elements 120 are disposed in the micro pixel package 100 in a pixel array of an m×n matrix, M/m (=A) micro pixel packages 100 may be disposed along the column direction, that is, the Z-axis direction, and N/n (=B) micro pixel packages 100 may be disposed along a row direction, that is, in an X-axis direction.

That is, the plurality of micro pixel packages 100 may be arranged two dimensionally on the first substrate 13, A micro pixel packages 100 may be disposed along the first direction (e.g., the column direction), that is, the Z-axis direction, and B micro pixel packages 100 may be disposed along a second direction (e.g., the row direction), that is, the X-axis direction.

In other words, the micro pixel package 100 may be arranged in a plurality of rows and a plurality of columns on the upper surface of the first substrate 13, and the display module 10 may include a plurality of micro pixel packages 100 in an A×B (A and B are integers greater than or equal to two) array.

As described above, the pixel intervals PP between adjacent pixels located on upper, lower, left, and right sides with respect to one pixel may all be equally maintained in the micro pixel package 100. Such pixel intervals PP may also be equally maintained in units of the display module 10.

As shown in FIGS. 14 and 15, the arrangement and intervals of the micro pixel packages 100 may be determined such that pixel intervals PP' between two pixels may be maintained to be equal to the pixel intervals PP in the single micro pixel package 100 even when the two adjacent pixels P are disposed in different micro pixel packages 100.

The pixel interval PP may be referred to as a pixel pitch, and in this embodiment, the pixel interval PP is defined as representing a distance from a center of one pixel to a center of an adjacent pixel. However, since the embodiment of the display module 10 is not limited thereto, other definitions may be applied to the pixel interval PP.

The arrangement relationship between the micro pixel package 100, in which the inorganic light-emitting element 120 and the micro pixel controller 130 are disposed, and the first substrate 13 has been described above. Hereinafter, the case in which some of the power lines are disposed in the micro pixel package 100 to minimize the IR drop will be described in more detail.

Figure 16:
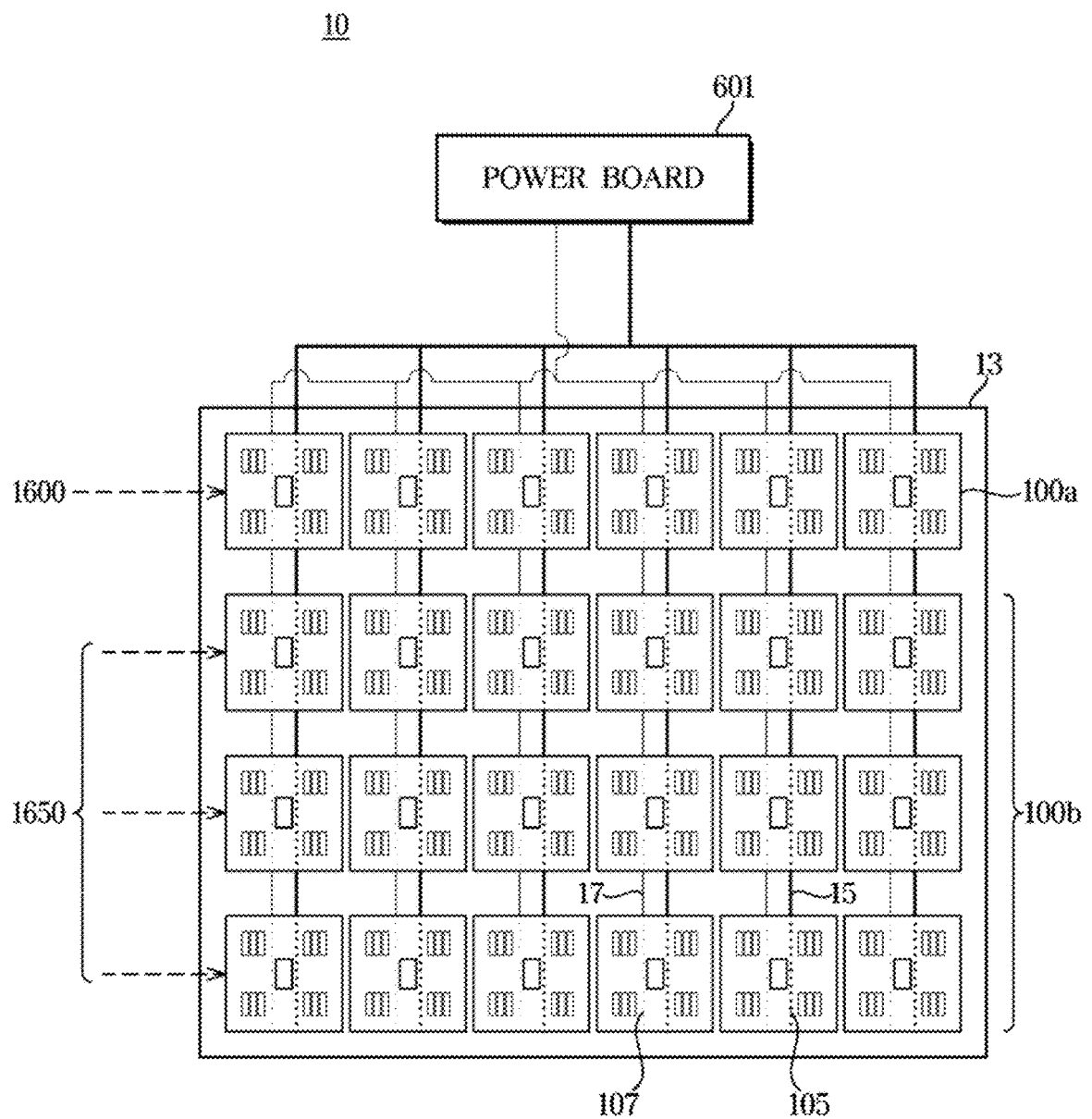
FIG. 16 is a diagram illustrating power lines of the module substrate on which a micro pixel package is disposed, in a display module according to an embodiment.
Figure 17:
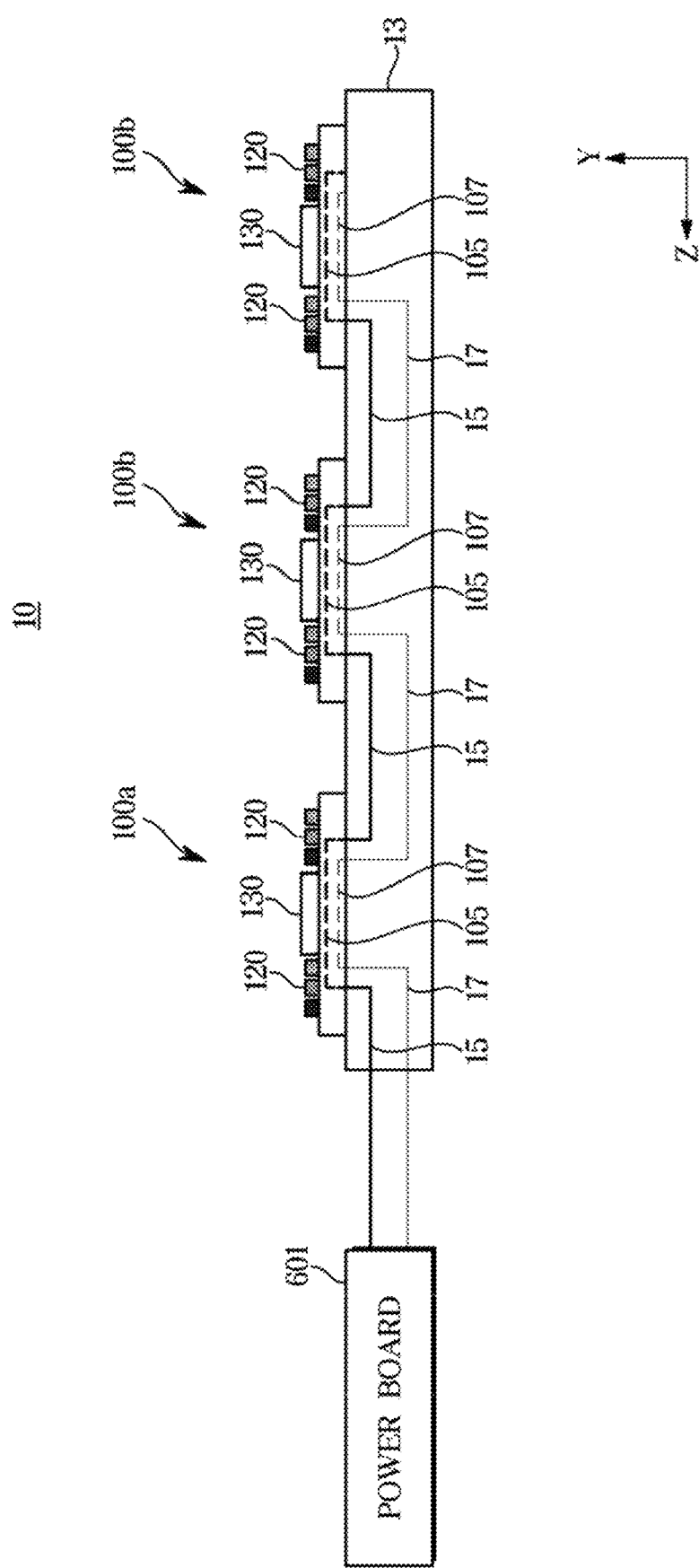
FIG. 17 is a diagram of power lines of a module substrate on which a micro pixel package is disposed, in a display module according to an embodiment.
Figure 18:
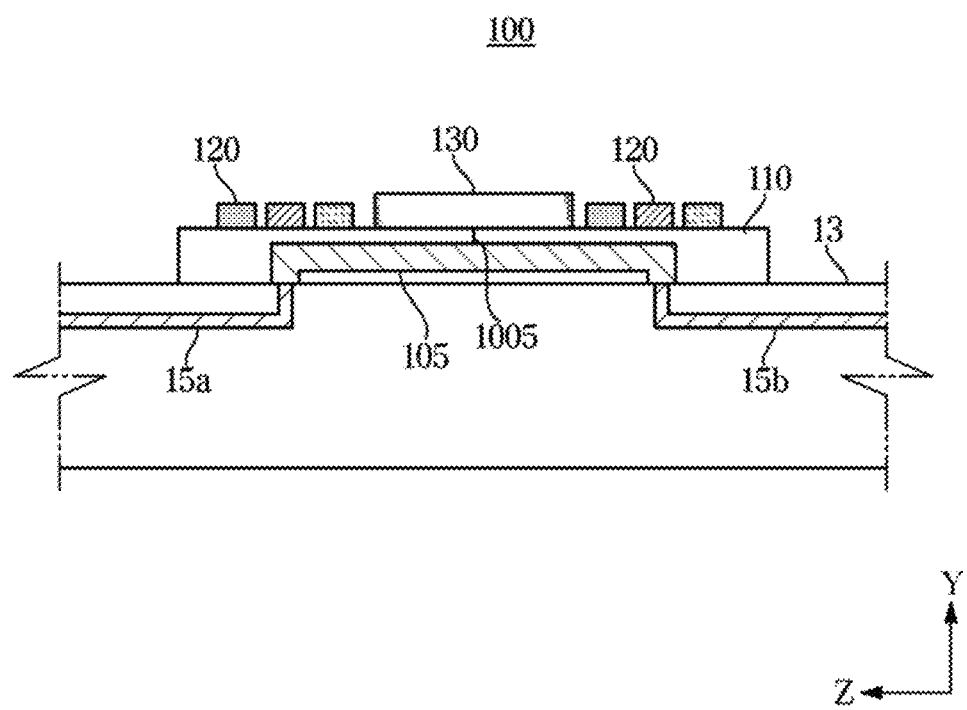
FIGS. 18 and 19 are diagrams of power lines in one micro pixel package, in a display module according to an embodiment.
Figure 19:
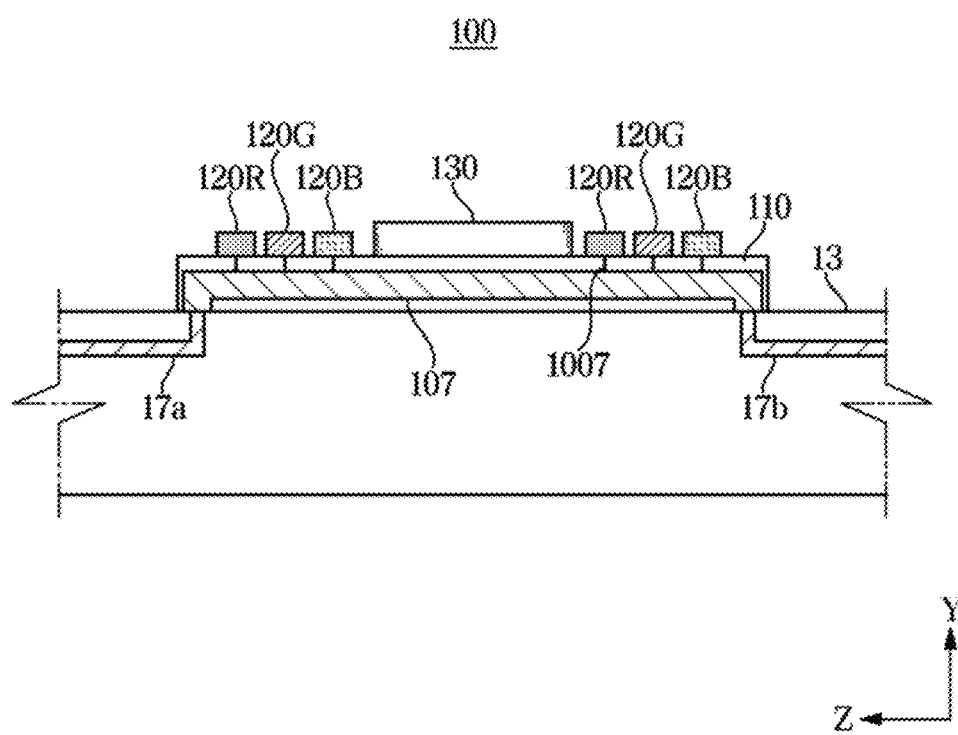

FIG. 16 is a diagram illustrating power lines of the module substrate on which a micro pixel package is disposed, in a display module according to an embodiment. FIG. 17 is a diagram of power lines of a module substrate on which a micro pixel package is disposed, in a display module according to an embodiment. FIGS. 18 and 19 are diagrams of power lines in one micro pixel package, in a display module according to an embodiment.

When each of the micro pixel controllers 130 and the inorganic light-emitting elements 120 are electrically connected to the power board 601 to receive the power supply voltage $V_{DD}$ and the reference voltage $V_{SS}$, a magnitude of each of the power supply voltage $V_{DD}$ and the reference voltage $V_{SS}$ may vary depending on a difference in line length.

For example, the further the micro pixel controller 130 is from the power board 601, the longer the line may be, and the magnitude of the supplied power supply voltage $V_{DD}$ may be reduced due to an IR drop caused by self-resistance of the line. Accordingly, as the distance from the power board 601 increases, the luminance of the pixel controlled by the micro pixel controller 130 may be reduced.

Accordingly, in the display apparatus 1 of the present disclosure, some of the power lines may be formed in the micro pixel package 100 so that the IR drop of each of the power supply voltage $V_{DD}$ and the reference voltage $V_{SS}$, which are supplied to each of the plurality of micro pixel controllers 130 disposed in the display module 10, may be minimized.

Referring to FIGS. 16 and 17, as described above, the plurality of micro pixel packages 100 may be arranged in a plurality of rows and a plurality of columns on the first substrate 13. That is, the display module 10 may include the plurality of micro pixel packages 100 arranged two dimensionally in A rows and B columns.

Each of the plurality of micro pixel packages 100 may receive the power supply voltage $V_{DD}$ and the reference voltage $V_{SS}$, supply the power supply voltage $V_{DD}$ to the micro pixel controller 130, and supply the reference voltage $V_{SS}$ to the inorganic light-emitting element 120.

The power supply voltage $V_{DD}$ and the reference voltage $V_{SS}$ supplied from the power board 601 may be applied to the micro pixel packages 100 disposed on the first substrate 13 through voltage lines 15 and 17 of the first substrate 13.

The power supply voltage $V_{DD}$ and the reference voltage $V_{SS}$ supplied from the power board 601 may be applied to micro pixel packages 100a arranged in a first row 1600.

At this point, each of micro pixel packages 100b arranged in rows 1650 other than the first row 1600 may receive the voltages $V_{DD}$ and $V_{SS}$ from the micro pixel package 100 of a previous row, and transmit the input voltages $V_{DD}$ and $V_{SS}$ to the micro pixel package 100 of a next row.

That is, the plurality of micro pixel packages 100 may include a plurality of first micro pixel packages 100a, which are arranged in the first row 1600 and receive the voltages $V_{DD}$ and $V_{SS}$ from the power board 601, and a plurality of second micro pixel packages 100b, which are arranged in the rows 1650 other than the first row 1600 and each of which receives the voltages $V_{DD}$ and $V_{SS}$ from the micro pixel package 100 of a previous row.

In other words, the plurality of micro pixel packages 100 may include the plurality of first micro pixel packages 100a, each of which receives the voltages $V_{DD}$ and $V_{SS}$ from the power board 601 and transmits the voltages $V_{DD}$ and $V_{SS}$ to the micro pixel package 100 adjacent thereto in the first direction, and the plurality of second micro pixel packages 100b, each of which receives the voltages from the micro pixel package 100 adjacent thereto in the first direction.

FIGS. 16 and 17 illustrate that the row located at the uppermost end of the first substrate 13 is the first row 1600 connected to the power board 601, but this is merely one embodiment, and according to an embodiment, there is no restriction on the location of the first row 1600. For example, the row located at the lowermost end or the row located at a side end may correspond to the first row 1600 depending on the connection location of the power board 601. In the following description, for convenience of description, the case in which the first row 1600 corresponds to the row located at the uppermost end will be described as an example.

In other words, the plurality of micro pixel packages 100 (e.g., 100a and 100b) may be arranged two dimensionally on the first substrate 13 of the display module 10, and each of the plurality of micro pixel packages 100 may be electrically connected to the micro pixel controller adjacent thereto in the first direction. The first direction may correspond to, for example, the column direction, that is, the Z-axis direction.

Each of the plurality of micro pixel packages 100 may be electrically connected to the micro pixel packages 100, which are disposed in the same column and disposed in adjacent rows, through the voltage lines 15 and 17 disposed on the first substrate 13.

In this case, each of the plurality of micro pixel packages 100 may include internal connection lines 105 and 107 that electrically connect between the voltage lines 15 and 17 electrically connected to the micro pixel package 100 of a previous row and the voltage lines 15 and 17 electrically connected to the micro pixel package 100 of a next row. As described above, the internal connection lines 105 and 107 may electrically connect the voltage lines 15 and 17, which are electrically connected to one of the micro pixel packages 100 adjacent to each other in the first direction and the voltage lines 15 and 17, which are electrically connected to another one of the micro pixel packages 100 adjacent to each other in the first direction, among the plurality of voltage lines.

That is, the voltages $V_{DD}$ and $V_{SS}$ may be input to the micro pixel package 100 through the voltage lines 15 and 17, which are provided on the first substrate 13 and connected to the micro pixel package 100 of a previous row, and may be output to the voltage lines 15 and 17, which are provided on the first substrate 13 and connected to the micro pixel package 100 of a next row, through the internal connection lines 105 and 107 provided in the micro pixel package 100.

In other words, each of the plurality of micro pixel packages 100 may receive the voltages $V_{DD}$ and $V_{SS}$ through the voltage lines 15 and 17 connected to the micro pixel package 100 of a previous row, and output the input voltages $V_{DD}$ and $V_{SS}$ to the voltage lines 15 and 17 connected to the micro pixel package 100 of a next row through the internal connection lines 105 and 107. That is, each of the plurality of micro pixel packages 100 may receive the voltages $V_{DD}$ and $V_{SS}$ through the voltage lines 15 and 17 connected to one of the micro pixel packages 100 adjacent to each other in the first direction, and output the input voltages $V_{DD}$ and $V_{SS}$ to the voltage lines 15 and 17 connected to another one of the micro pixel packages 100 adjacent to each other in the first direction through the internal connection lines 105 and 107.

The display module 10 may include a plurality of voltage lines 15 and 17 that are disposed in each column of the plurality of micro pixel packages 100, electrically connect between the micro pixel packages 100 disposed in adjacent rows, and transmit the voltage between the micro pixel packages 100.

The plurality of voltage lines 15 and 17 may include a plurality of power supply voltage lines 15 for the power supply voltage $V_{DD}$ and a plurality of reference voltage lines 17 for the reference voltage $V_{SS}$.

Each of the plurality of power supply voltage lines 15 may electrically connect between two micro pixel packages 100 disposed in adjacent rows while being disposed in the same column, and transmit the power supply voltage $V_{DD}$ between the two micro pixel packages 100.

Each of the plurality of reference voltage lines 17 may electrically connect between two micro pixel packages 100 disposed in adjacent rows while being disposed in the same column, and transmit the reference voltage $V_{SS}$ between the two micro pixel packages 100.

The plurality of voltage lines 15 and 17 may be disposed on the first substrate 13 corresponding to the module substrate and may be electrically connected to the micro pixel packages 100 disposed on the upper surface of the first substrate 13.

Each of the plurality of micro pixel packages 100 may be disposed on the first substrate 13 and may be electrically connected to the voltage lines 15 and 17.

The internal connection lines 105 and 107 of each of the plurality of micro pixel packages 100 may be electrically connected to the voltage lines 15 and 17, respectively, that are electrically connected to the micro pixel package 100 disposed in a previous row while being disposed in the same column. In addition, the internal connection lines 105 and 107 of each of the plurality of micro pixel packages 100 may be electrically connected to the voltage lines 15 and 17, respectively, that are electrically connected to the micro pixel package 100 disposed in a next row while being disposed in the same column.

Accordingly, the internal connection lines 105 and 107 may electrically connect the voltage lines 15 and 17 connected to the micro pixel package 100 of a previous row and the voltage lines connected to the micro pixel package 100 of a next row.

The internal connection lines may include a first internal connection line 105 through which the power supply voltage $V_{DD}$ flows and a second internal connection line 107 through which the reference voltage $V_{SS}$ flows.

As a result, as shown in FIG. 18, each of the plurality of micro pixel packages 100 may receive the power supply voltage $V_{DD}$ through a power supply voltage line 15a connected to the micro pixel package disposed in a previous row while being disposed in the same column, and may output the input power supply voltage $V_{DD}$ to a power supply voltage line 15b connected to the micro pixel package of a next row through the first internal connection line 105.

At this point, the micro pixel controller 130 may be electrically connected to the first internal connection line 105 through a voltage supply line 1005 and may receive the power supply voltage $V_{DD}$. That is, the first internal connection line 105 may be electrically connected to the micro pixel controller 130 and may transmit the power supply voltage $V_{DD}$.

Further, as shown in FIG. 19, each of the plurality of micro pixel packages 100 may receive the reference voltage $V_{SS}$ through a reference voltage line 17a connected to the micro pixel package disposed in a previous row while being disposed in the same column, and may output the input reference voltage $V_{SS}$ to a reference voltage line 17b connected to the micro pixel package of a next row through the second internal connection line 107.

At this point, each of the plurality of inorganic light-emitting elements 120 may be electrically connected to the second internal connection line 107 through a voltage supply line 1007 and may receive the reference voltage $V_{SS}$. That is, the second internal connection line 107 may be electrically connected to the plurality of inorganic light-emitting elements 120 and may transmit the reference voltage $V_{SS}$.

The internal connection lines 105 and 107 provided in the micro pixel package 100 have improved line resistance as compared to the voltage lines 15 and 17 provided on the module substrate 13, and thus may have high electron mobility. Specifically, when the line is mounted in the micro pixel package 100, process difficulty may be reduced as compared with when the line is mounted on the module substrate. Accordingly, as shown in FIGS. 18 and 19, the internal connection lines 105 and 107 provided in the micro pixel package 100 may be formed to be thicker than the voltage lines 15 and 17 provided on the module substrate 13, and thus may have high electron mobility.

As such, in the display module 10 of the present disclosure, the voltage lines 15 and 17 that electrically connect between the micro pixel packages 100 are disposed on the module substrate, and the internal connection lines 105 and 107 that electrically connect between the voltage lines 15 and 17 are disposed inside the micro pixel package 100 so that some of the power lines are provided in the micro pixel package 100.

In the display module 10, through the internal connection lines 105 and 107 inside the micro pixel package 100, the rate at which the voltage passes through the voltage lines 15 and 17 of the module substrate 13 having low electron mobility may be reduced, and the IR drop of the voltage may be minimized as compared with the case in which the voltages $V_{DD}$ and $V_{SS}$ are supplied to the micro pixel package 100 through only the voltage lines 15 and 17 of the module substrate 13.

Thus, the display module 10 allows the plurality of micro pixel controllers 130 to be driven with the same voltage regardless of a distance from the power board 601, thereby preventing the IR drop that may occur according to the distance from the power board 601. As the IR drop is minimized, the micro pixel controller 130 may provide the intended driving current $C_D$ to the inorganic light-emitting element 120 to provide the intended luminance by controlling the inorganic light-emitting elements 120 at a constant voltage, and thus, problems of luminance degradation and Mura effects may be solved.

Further, the display module 10 of the present disclosure may have shorter voltage lines 15 and 17 than the case in which each of the micro pixel packages 100 is electrically connected to the power board 601 by allowing the output voltage of the micro pixel package 100 to be transmitted to the micro pixel package of a next row, so that the IR drop may be minimized.

The case in which some of the power lines are disposed in the micro pixel package 100 to minimize the IR drop has been described above in detail. Hereinafter, the case in which some of the power lines are disposed in the micro pixel controller 130 to minimize the IR drop will be described in detail.

Figure 20:
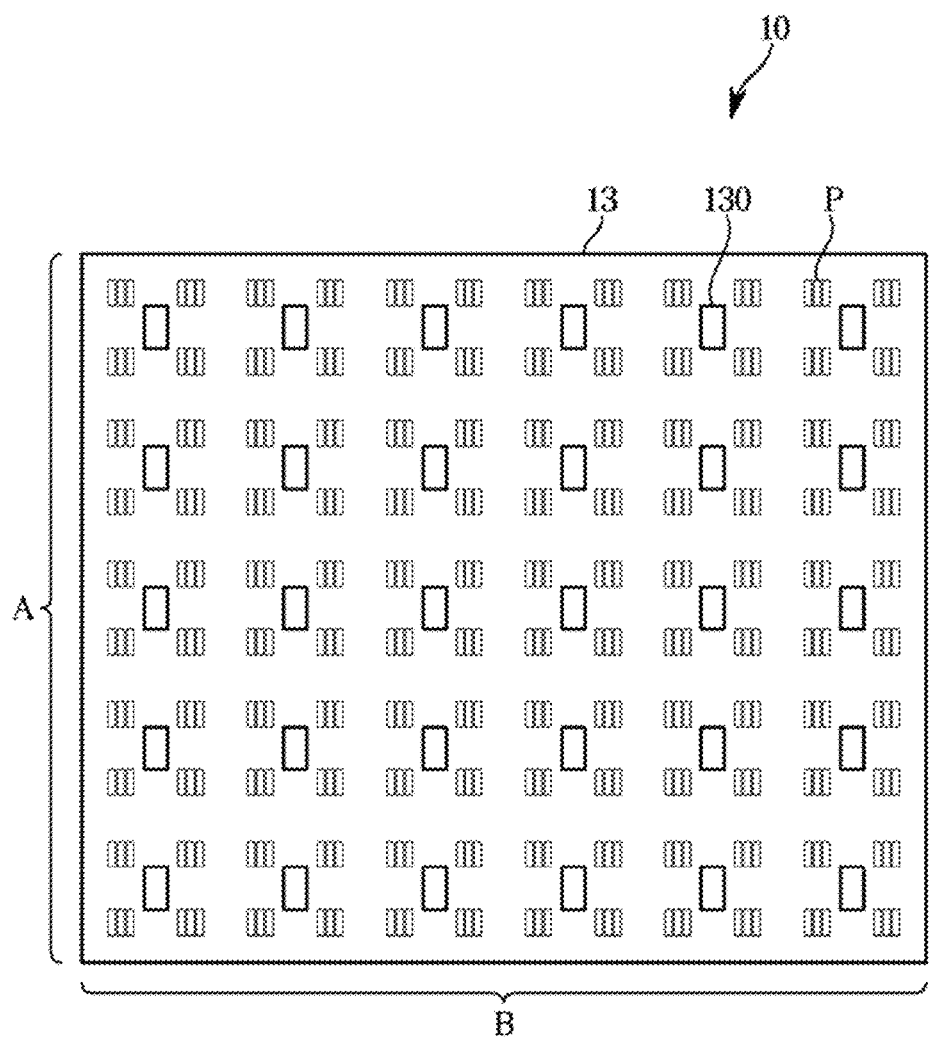
FIG. 20 is a diagram of an example of an arrangement of a micro pixel controllers and inorganic light-emitting elements constituting a display module according to an embodiment.

FIG. 20 is a diagram of an example of an arrangement of a micro pixel controllers and inorganic light-emitting elements constituting a display module according to an embodiment.

Referring to FIG. 20, the display module 10 according to one embodiment may not include the micro pixel packages 100 and may include the micro pixel controllers 130 and the inorganic light-emitting elements 120 directly disposed on the first substrate 13.

The pixels P each including the plurality of inorganic light-emitting elements 120 may be arranged in rows and columns on the first substrate 13 corresponding to the module substrate of the display module 10. That is, the pixels P may be arranged on the upper surface of the first substrate 13 in a two-dimensional array of M rows and N columns.

In this case, the micro pixel controllers 130 may also be arranged in a plurality of rows and a plurality of columns on the first substrate 13. That is, the micro pixel controllers 130 may be arranged on the first substrate 13 in a two-dimensional array consisting of A rows and B columns.

In other words, the plurality of micro pixel controllers 130 may be arranged two dimensionally on the first substrate 13 of the display module 10, and each of the plurality of micro pixel controllers 130 may be electrically connected to the micro pixel controller adjacent thereto in the first direction. The first direction may correspond to, for example, the column direction, that is, the Z-axis direction.

For example, as shown in FIG. 20, the micro pixel controller 130 may be disposed on the upper surface of the first substrate 13 and disposed at a center portion of a space between the pixels P1, P2, P3, and P4 to be controlled. In this case, the micro pixel controller 130 may be electrically connected to an anode of each of the pixels P, which are to be controlled, through an anode line, and may be electrically connected to a cathode of each of the pixels P, which are to be controlled, through a cathode line.

However, depending on the embodiment, the micro pixel controller 130 may not be disposed at the center portion of the space between the pixels P1, P2, P3, and P4, and may be disposed without limitation as long as the micro pixel controllers 130 are disposed in rows and columns and each of the micro pixel controllers 130 is electrically connected to the pixels P to be controlled. For example, the micro pixel controller 130 may be disposed at a location corresponding to a pixel region of each of the four pixels P1, P2, P3, and P4 controlled by the micro pixel controller 130. In this embodiment, the pixel region is a region in which each pixel is located, and when an active region of the display panel 11 is partitioned into the same array (MXN) as the array of pixels, a region including each pixel may be defined as a pixel region of the corresponding pixel. As a more specific example, the micro pixel controller 130 may be disposed in one region in which the pixel regions of the four pixels P1, P2, P3, and P4 controlled by the micro pixel controller 130 are combined (i.e., an entire pixel region PW). The micro pixel controller 130 may be disposed at a location corresponding to a center portion of the entire pixel region PW.

In addition, according to the embodiment, the micro pixel controller 130 may be disposed on a lower surface of the first substrate 13 rather than the upper surface of the first substrate 13, and in this case, the micro pixel controller 130 may be electrically connected to the pixels P, which are to be controlled, through via hole lines. Hereinafter, for convenience of description, the case in which the micro pixel controller 130 is disposed on the upper surface of the first substrate 13 will be described as an example.

In this case, distances between adjacent pixels of the plurality of pixels included in the display panel 11 may all be the same. In this embodiment, when it is described that certain values are the same, this may include not only a case in which the corresponding values are completely the same, but also a case in which the corresponding values are the same within a predetermined error range.

Figure 21:
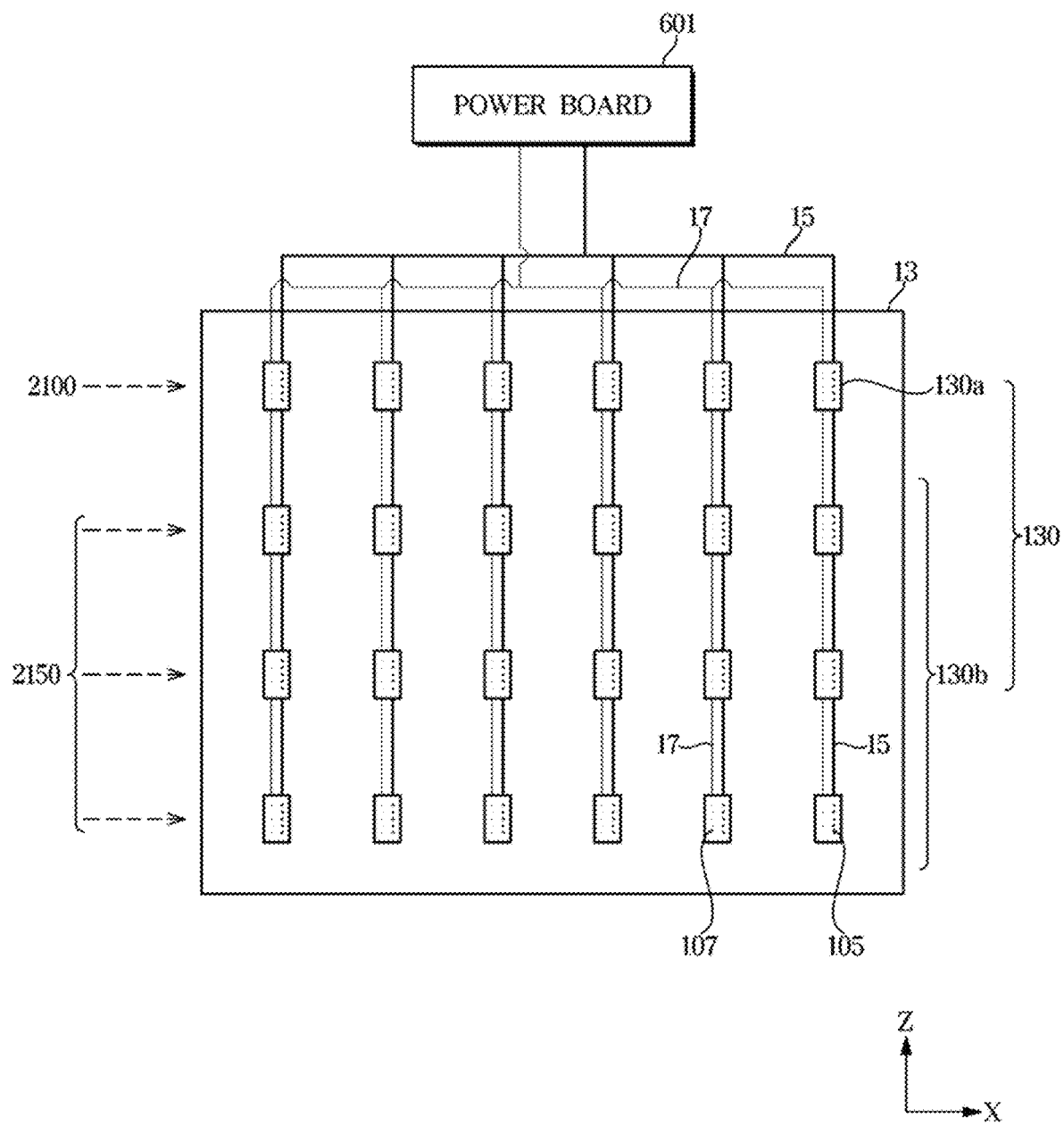
FIG. 21 is a diagram illustrating the power lines of the module substrate on which a micro pixel controller is disposed, in a display module according to an embodiment.
Figure 22:
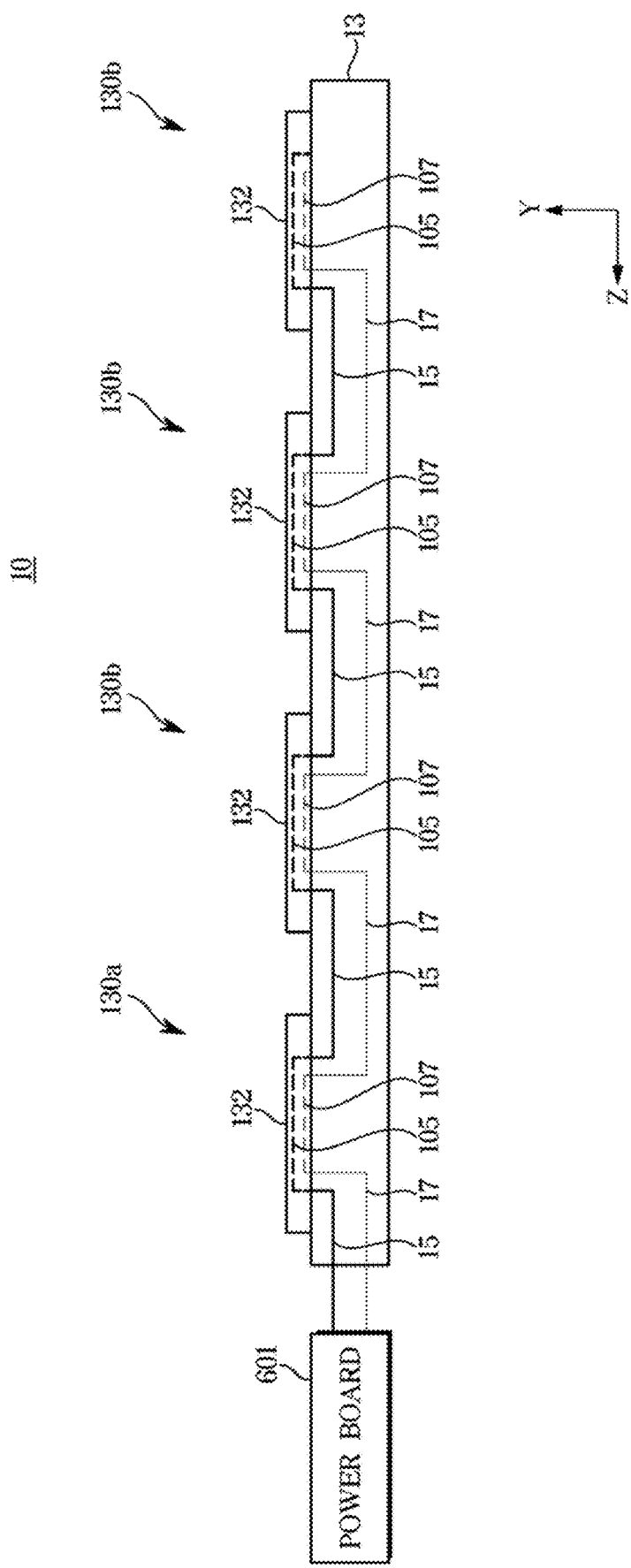
FIG. 22 is a diagram of power lines of a module substrate on which a micro pixel controller is disposed, in a display module according to an embodiment.
Figure 23:
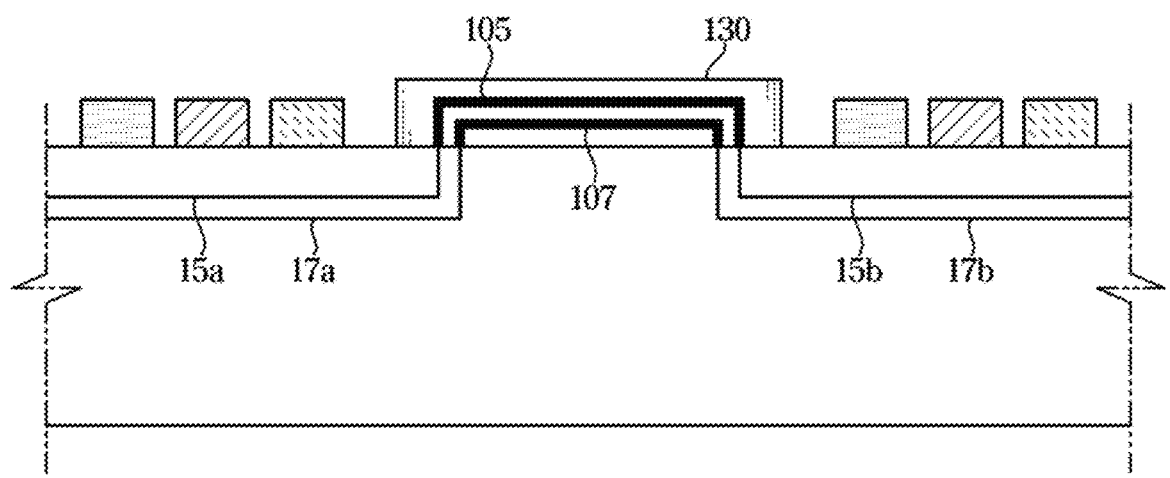
FIG. 23 is a diagram of power lines in one micro pixel controller, in a display module according to an embodiment.

FIG. 21 is a diagram illustrating the power lines of the module substrate on which a micro pixel controller is disposed, in a display module according to an embodiment. FIG. 22 is a diagram of power lines of a module substrate on which a micro pixel controller is disposed, in a display module according to an embodiment. FIG. 23 is a diagram of power lines in one micro pixel controller, in a display module according to an embodiment.

In FIGS. 21 and 22, as described above, the plurality of micro pixel controllers 130 may be arranged in a plurality of rows and a plurality of columns on the first substrate 13. That is, the display module 10 may include the plurality of micro pixel controllers 130 arranged two dimensionally in A rows and B columns.

That is, the plurality of micro pixel controllers 130 may be arranged two dimensionally on the first substrate 13, A micro pixel controllers 130 may be disposed along the first direction (e.g., the column direction), that is, the Z-axis direction, and B micro pixel controllers 130 may be disposed along a second direction (e.g., the row direction) (i.e., the X-axis direction).

Each of the plurality of micro pixel controllers 130 may receive the power supply voltage $V_{DD}$ and the reference voltage $V_{SS}$, supply the power supply voltage $V_{DD}$ to the pixel circuit 131, and supply the reference voltage $V_{SS}$ to the inorganic light-emitting element 120.

The power supply voltage $V_{DD}$ and the reference voltage $V_{SS}$ supplied from the power board 601 may be applied to the micro pixel controllers 130 disposed on the first substrate 13 through voltage lines 15 and 17 of the first substrate 13.

The power supply voltage $V_{DD}$ and the reference voltage $V_{SS}$ supplied from the power board 601 may be applied to micro pixel controllers 130*a* arranged in a first row 2100.

At this point, each of micro pixel controllers 130*b* arranged in rows 2150 other than the first row 2100 may receive the voltages $V_{DD}$ and $V_{SS}$ from the micro pixel controller of a previous row, and transmit the input voltages $V_{DD}$ and $V_{SS}$ to the micro pixel controller of a next row.

That is, the plurality of micro pixel controllers 130 may include a plurality of first micro pixel controllers 130*a*, which are arranged in the first row 2100 and receive the voltages $V_{DD}$ and $V_{SS}$ from the power board 601, and a plurality of second micro pixel controllers 130*b*, which are arranged in the rows 2150 other than the first row 2100 and each of which receives the voltages $V_{DD}$ and $V_{SS}$ from the micro pixel controller of a previous row.

In other words, the plurality of micro pixel controllers 130 may include the plurality of first micro pixel controllers 130*a*, each of which receives the voltages $V_{DD}$ and $V_{SS}$ from the power board 601 and transmits the voltages $V_{DD}$ and $V_{SS}$ to the micro pixel controller adjacent thereto in the first direction, and the plurality of second micro pixel controllers 130*b*, each of which receives voltages from the micro pixel controller adjacent thereto in the first direction.

FIGS. 21 and 22 illustrate that the row located at the uppermost end of the first substrate 13 is the first row 2100 connected to the power board 601, but this is merely one embodiment, and according to an embodiment, there is no restriction on the location of the first row 2100. For example, the row located at the lowermost end or the row located at a side end may correspond to the first row 2100 depending on the connection location of the power board 601. In the following description, for convenience of description, the case in which the first row 2100 corresponds to the row located at the uppermost end will be described as an example.

Each of the plurality of micro pixel controllers 130 may be electrically connected to the micro pixel controllers, which are disposed in the same column and disposed in adjacent rows, through voltage lines 15 and 17 disposed on the first substrate 13.

In other words, the plurality of micro pixel controllers 130 may be arranged two dimensionally on the first substrate 13 of the display module 10, and each of the plurality of micro pixel controllers 130 may be electrically connected to the micro pixel controller adjacent thereto in the first direction. The first direction may correspond to, for example, the column direction, that is, the Z-axis direction.

In this case, each of the plurality of micro pixel controllers 130 may include internal connection lines 105 and 107 that electrically connect between the voltage lines 15 and 17 electrically connected to the micro pixel controller of a previous row and the voltage lines 15 and 17 electrically connected to the micro pixel controller of a next row.

That is, the voltages $V_{DD}$ and $V_{SS}$ may be input to the micro pixel controller 130 through the voltage lines 15 and 17, which are provided on the first substrate 13 and connected to the micro pixel controller of a previous row, and may be output to the voltage lines 15 and 17, which are provided on the first substrate 13 and connected to the micro pixel controller of a next row, through the internal connection lines 105 and 107 provided in the micro pixel controller 130.

In other words, each of the plurality of micro pixel controllers 130 may receive the voltages $V_{DD}$ and $V_{SS}$ through the voltage lines 15 and 17 connected to the micro pixel controller of a previous row, and output the input voltages $V_{DD}$ and $V_{SS}$ to the voltage lines 15 and 17 connected to the micro pixel controller of a next row through the internal connection lines 105 and 107.

Each of the plurality of micro pixel controllers 130 may be electrically connected to the micro pixel controller adjacent thereto in the first direction through the voltage lines provided on the first substrate 13, and may include the internal connection lines electrically connecting the voltage lines electrically connected to one of the micro pixel controllers 130 adjacent thereto in the first direction and the voltage lines electrically connected to another one of the micro pixel controllers 130 adjacent thereto in the first direction. Each of the plurality of micro pixel controllers 130 may transmit a voltage input from one of the micro pixel controllers 130, which is electrically connected thereto through the internal connection lines, to another one of the micro pixel controllers 130, which is electrically connected thereto.

The display module 10 may include a plurality of voltage lines 15 and 17 that are disposed in each column of the plurality of micro pixel controllers 130, electrically connect between the micro pixel controllers disposed in adjacent rows, and transmit the voltages between the micro pixel controllers 130.

The plurality of voltage lines 15 and 17 may include a plurality of power supply voltage lines 15 for the power supply voltage $V_{DD}$ and a plurality of reference voltage lines 17 for the reference voltage $V_{SS}$.

Each of the plurality of power supply voltage lines 15 may electrically connect between two micro pixel controllers disposed in adjacent rows while being disposed in the same column, and transmit the power supply voltage $V_{DD}$ between the two micro pixel controllers.

Each of the plurality of reference voltage lines 17 may electrically connect between two micro pixel controllers disposed in adjacent rows while being disposed in the same column, and transmit the reference voltage $V_{SS}$ between the two micro pixel controllers 130.

The plurality of voltage lines 15 and 17 may be disposed on the first substrate 13 corresponding to the module substrate and may be electrically connected to the micro pixel controllers 130 disposed on the upper surface of the first substrate 13.

Each of the plurality of micro pixel controllers 130 may be disposed on the first substrate 13 and may be electrically connected to the voltage lines 15 and 17.

The internal connection lines 105 and 107 of each of the plurality of micro pixel controllers 130 may be electrically connected to the voltage lines 15 and 17, respectively, that are electrically connected to the micro pixel controller disposed in a previous row while being disposed in the same column. In addition, the internal connection lines 105 and 107 of each of the plurality of micro pixel controllers 130 may be electrically connected to the voltage lines 15 and 17, respectively, that are electrically connected to the micro pixel controller disposed in a next row while being disposed in the same column. As described above, the internal connection lines 105 and 107 may electrically connect the voltage lines 15 and 17, which are electrically connected to one of the micro pixel controllers adjacent to each other in the first direction, and the voltage lines 15 and 17, which are electrically connected to another one of the micro pixel controllers adjacent to each other in the first direction, among the plurality of voltage lines.

Accordingly, the internal connection lines 105 and 107 may electrically connect the voltage lines 15 and 17 connected to the micro pixel controller of a previous row and the voltage lines connected to the micro pixel controller of a next row.

The internal connection lines 105 and 107 may include a first internal connection line 105 through which the power supply voltage $V_{DD}$ flows and a second internal connection line 107 through which the reference voltage $V_{SS}$ flows.

That is, each of the plurality of micro pixel controllers 130 may receive the voltages $V_{DD}$ and $V_{SS}$ through the voltage lines 15 and 17 connected to one of the micro pixel controllers adjacent to each other in the first direction, and output the input voltages $V_{DD}$ and $V_{SS}$ to the voltage lines 15 and 17 connected to another one of the micro pixel controllers adjacent to each other in the first direction through the internal connection lines 105 and 107.

As a result, as shown in FIG. 23, each of the plurality of micro pixel controllers 130 may receive the power supply voltage $V_{DD}$ through a power supply voltage line 15a connected to the micro pixel controller 130 disposed in a previous row while being disposed in the same column, and may output the input power supply voltage $V_{DD}$ to a power supply voltage line 15b connected to the micro pixel controller of a next row through the first internal connection line 105.

Further, as shown in FIG. 23, each of the plurality of micro pixel controllers 130 may receive the reference voltage $V_{SS}$ through a reference voltage line 17a connected to the micro pixel controller disposed in a previous row while being disposed in the same column, and may output the input reference voltage $V_{SS}$ to a reference voltage line 17b connected to the micro pixel controller of a next row through the second internal connection line 107.

At this point, the first internal connection line 105 may be electrically connected to the pixel circuit 131 (at least one TFT) to supply the power supply voltage $V_{DD}$ to the pixel circuit 131. In addition, the second internal connection line 107 may be electrically connected to the cathode line to supply the reference voltage $V_{SS}$ to the cathode of the inorganic light-emitting element 120.

The internal connection lines 105 and 107 provided in the micro pixel controller 130 have improved line resistance as compared to the voltage lines 15 and 17 provided on the module substrate 13, and thus may have high electron mobility. Specifically, when the line is mounted in the micro pixel controller 130, process difficulty may be reduced as compared with when the line is mounted on the module substrate. Accordingly, as shown in FIG. 23, the internal connection lines 105 and 107 provided in the micro pixel controller 130 may be formed to be thicker than the voltage lines 15 and 17 provided on the module substrate 13, and thus may have high electron mobility.

As such, in the display module 10 of the present disclosure, the voltage lines 15 and 17 that electrically connect between the micro pixel controllers 130 are disposed on the module substrate, and the internal connection lines 105 and 107 that electrically connect between the voltage lines 15 and 17 are disposed inside the micro pixel controller 130 so that some of the power lines are provided in the micro pixel controller 130.

In the display module 10, through the internal connection lines 105 and 107 inside the micro pixel controller 130, the rate at which the voltage passes through the voltage lines 15 and 17 of the module substrate 13 having low electron mobility may be reduced, and the IR drop of the voltage may be minimized as compared with the case in which the voltages $V_{DD}$ and $V_{SS}$ are supplied to the micro pixel controller 130 through only the voltage lines 15 and 17 of the module substrate 13.

Thus, the display module 10 allows the plurality of micro pixel controllers 130 to be driven with the same voltage regardless of a distance from the power board 601, thereby preventing the IR drop that may occur according to the distance from the power board 601. As the IR drop is minimized, the micro pixel controller 130 may provide the intended driving current $C_D$ to the inorganic light-emitting element 120 to provide the intended luminance by controlling the inorganic light-emitting elements 120 at a constant voltage, and thus, problems of luminance degradation and Mura effects may be solved.

Further, the display module 10 may have shorter voltage lines 15 and 17 than the case in which each of the micro pixel controllers 130 is electrically connected to the power board 601 by allowing the output voltage of the micro pixel controller 130 to be transmitted to the micro pixel controller of a next row, so that the IR drop may be minimized.

Figure 24:
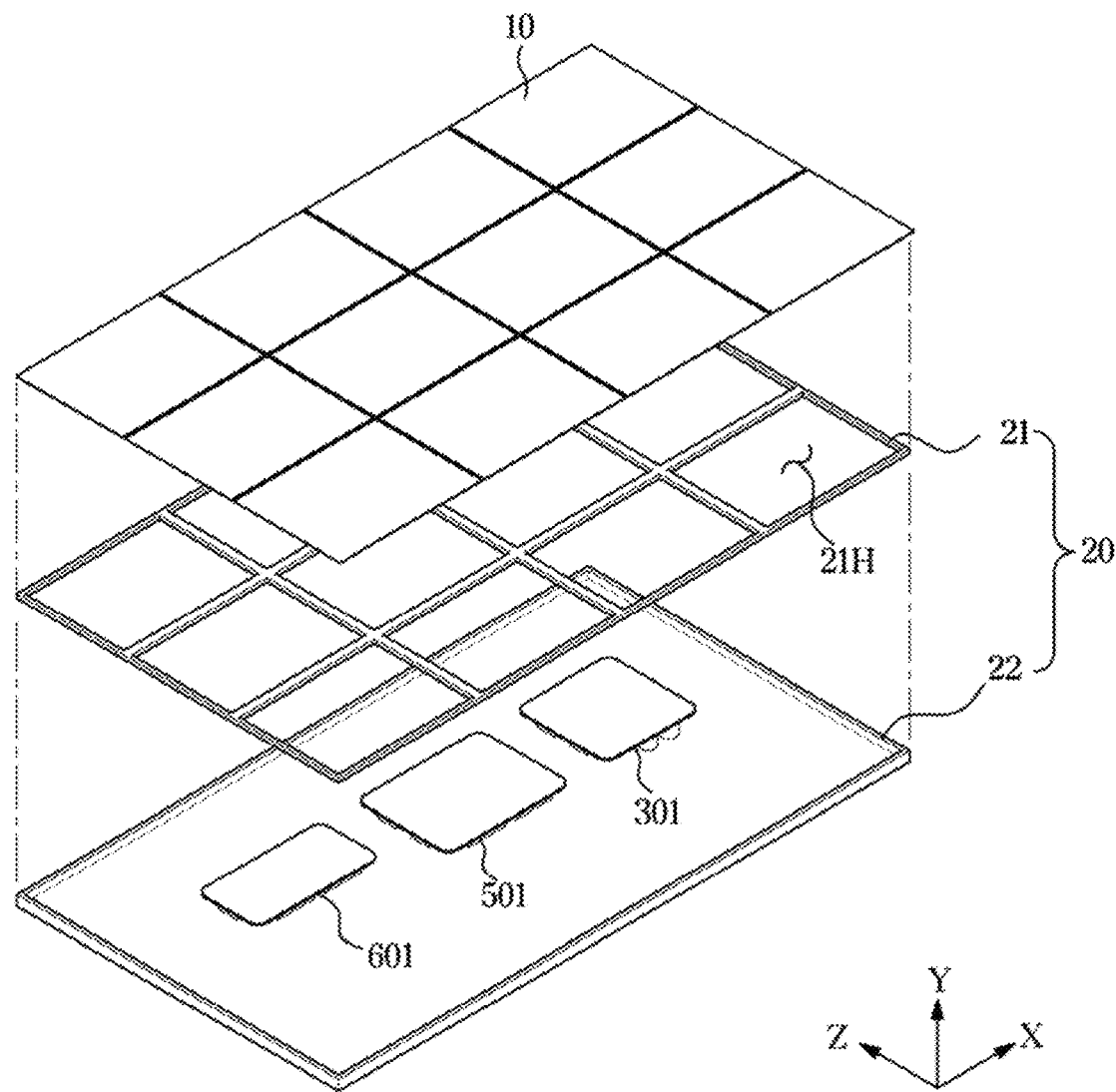
FIG. 24 is a diagram illustrating an example of a method in which a plurality of display modules are coupled to a housing in a display apparatus according to an embodiment.

FIG. 24 is a diagram illustrating an example of a method in which a plurality of display modules are coupled to a housing in a display apparatus according to an embodiment.

As described above, the plurality of display modules 10 may be arranged in the form of a two-dimensional matrix and fixed to the housing 20. Referring to the example of FIG. 24, the plurality of display modules 10 may be installed in a frame 21 located therebelow, and the frame 21 may have a two-dimensional mesh structure having an open partial region corresponding to the plurality of display modules 10.

As many openings 21H as the number of the display modules 10 may be formed in the frame 21, and the openings 21H may have the same arrangement as the plurality of display modules 10.

The plurality of display modules 10 may be mounted in the frame 21 through a method of using magnetic force by a magnet, coupling by a mechanical structure, bonding by an adhesive, or the like. There is no limitation on the method in which the display module 10 is mounted in the frame 21.

The driving board 501, the main board 301, and the power board 601 may be disposed below the frame 21, and may be electrically connected to each of the plurality of display modules 10 through the openings 21H formed in the frame 21.

A lower cover 22 is coupled to a lower portion of the frame 21, and the lower cover 22 may form a lower exterior of the display apparatus 1.

In the above-described example, the case in which the display modules 10 are arranged two dimensionally was taken as an example. However, the display modules 10 may be arranged in one dimension, and in this case, the structure of the frame 21 may also be transformed into a one-dimensional mesh structure.

As such, the display apparatus 1 of the present disclosure may implement a large-area screen by tiling the plurality of display modules 10 and fixing the display modules 10 to the housing 20. Thus, in the display apparatus 1, the power supply voltage line 15 and the reference voltage line 17 for transmitting the power supply voltage $V_{DD}$ and the reference voltage $V_{SS}$ may be designed to be shorter than a case in which one plate is applied to implement a large-area screen, so that the IR drop generated in proportion to the line length may be minimized.

Figure 25:
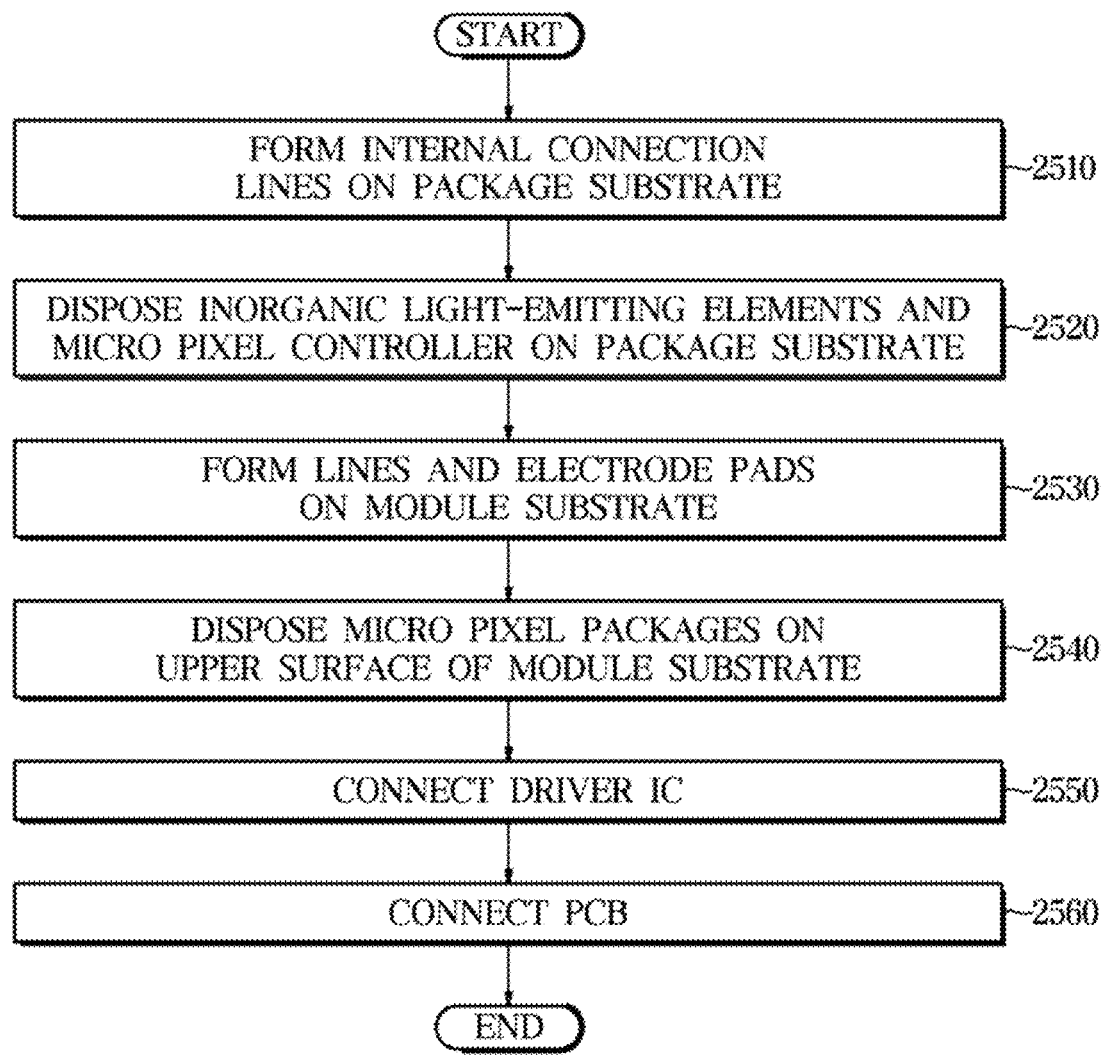
FIG. 25 is a flowchart of a method of manufacturing a display module according to an embodiment.

FIG. 25 is a flowchart of a method of manufacturing a display module according to an embodiment. FIGS. 26, 27, 28, 29, 30 and 31 are diagrams illustrating a display module manufactured by some operations shown in FIG. 25, according to an embodiment.

Referring to FIG. 25, in operation 2510, internal connection lines 105 and 107 are formed in a package substrate.

The package substrate refers to a second substrate 110 described above, and the internal connection lines 105 and 107 may be formed inside the second substrate 110. For example, a metal material layer such as copper may be formed in the second substrate 110, and the internal connection lines 105 and 107 may be formed in the second substrate 110 through a photolithography process including processes such as coating, exposing, developing, or the like of a photosensitive material and an etching process that selectively removes unnecessary portions. However, according to the embodiment, the internal connection lines 105 and 107 may be formed in an upper surface, a lower surface, or a side surface of the second substrate 110.

In this case, the internal connection lines 105 and 107 may include a first internal connection line 105 through which a power supply voltage $V_{DD}$ flows and a second internal connection line 107 through which a reference voltage $V_{SS}$ flows.

Figure 26:
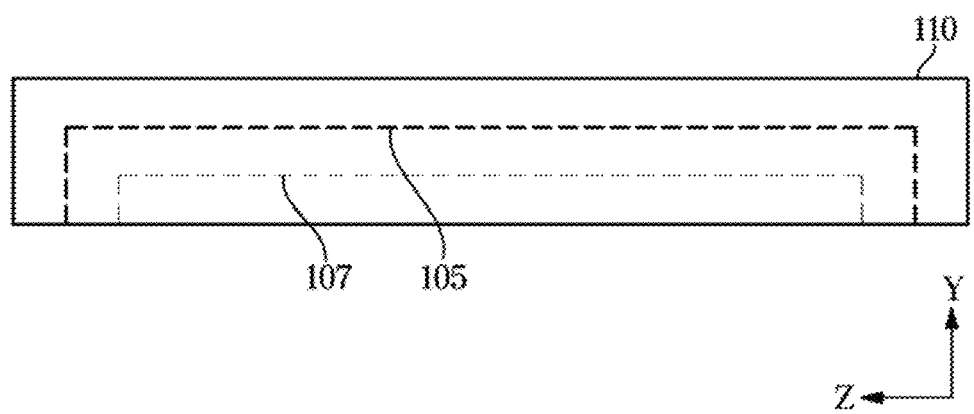

FIG. 26 is a diagram illustrating a side surface of the second substrate 110 in which the internal connection lines 105 and 107 are formed, according to an embodiment.

As shown in FIG. 26, the first internal connection line 105 for the power supply voltage $V_{DD}$ and the second internal connection line 107 for the reference voltage $V_{SS}$ may be formed in the second substrate 110 by the above-described processes.

Although not shown in FIG. 26, electrode pads, to which inorganic light-emitting elements 120 and a micro pixel controller 130 are electrically connected, may be formed on the second substrate 110.

Referring to FIG. 25, in operation 2520, the inorganic light-emitting elements 120 and the micro pixel controller 130 may be disposed on the package substrate in which the internal connection lines are formed.

As described above, the inorganic light-emitting element 120 may be a micro-LED. The micro-LED on a wafer or temporary substrate may be picked up and transported by a transport mechanism and transferred onto the second substrate 110. At this point, the inorganic light-emitting elements 120 may be transferred such that anodes and cathodes face the upper surface of the second substrate 110. As a transfer method, any of known techniques such as a method using laser, a method using a stamp, a method using a roller, and the like may be employed.

Further, depending on a method of connecting the inorganic light-emitting element 120 and the electrode pad, a soldering material or a conductive adhesive may be disposed on or applied to the electrode pad formed on the upper surface of the second substrate 110.

The electrode pad, to which the micro pixel controller 130 may be electrically connected, may be formed on the upper surface of the second substrate 110 corresponding to the package substrate. In this case, the micro pixel controller 130 may be disposed on the electrode pad and electrically connected to the second substrate 110.

The micro pixel controller 130 has a pixel circuit 131 therein for controlling the inorganic light-emitting elements 120 on the second substrate 110, and the structure and operation thereof are the same as those described in the embodiment of the display module 10.

Meanwhile, prior to mounting the micro pixel controller 130 on the second substrate 110, it is possible to individually perform circuit inspection, and only the micro pixel controller 130 determined as a good product by the circuit inspection may be mounted on the second substrate 110. Accordingly, in comparison with a case in which a TFT circuit is directly mounted on the module substrate, the circuit may be easily inspected and defective products may be easily replaced.

Figure 27:
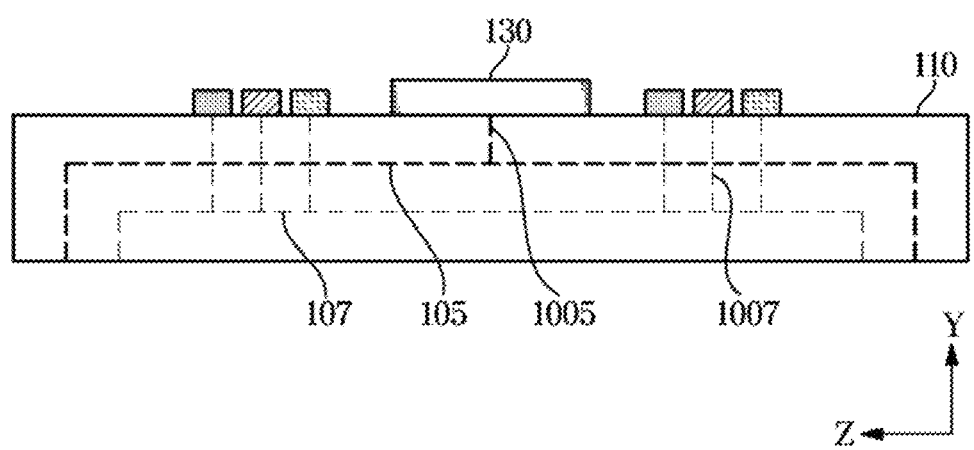

FIG. 27 is a diagram illustrating a side surface of the second substrate 110 onto which the inorganic light-emitting elements 120 and the micro pixel controller 130 are transferred according to an embodiment. By transferring the inorganic light-emitting elements 120 and the micro pixel controller 130 onto the upper surface of the second substrate 110 to which the soldering material or conductive adhesive is disposed or applied, the anode and the cathode of the inorganic light-emitting element 120 and a connection pin of the micro pixel controller 130 may be electrically connected to the electrode pads of the second substrate 110.

Before the inorganic light-emitting elements 120 and the micro pixel controller 130 are disposed on the second substrate 110, a voltage supply line 1005 electrically connecting the first internal connection line 105 to the micro pixel controller 130 and a voltage supply line 1007 electrically connecting the second internal connection line 107 and the inorganic light-emitting element 120 may be formed in the second substrate 110.

Referring to FIG. 25, in operation 2530, lines and electrode pads are formed on the module substrate.

The module substrate refers to a first substrate 13 described above, and the lines and the electrode pads may be formed on an upper surface and a lower surface of the first substrate 13. For example, a metal material layer such as copper may be formed on the upper surface of the first substrate 13, and the lines and the electrode pads may be formed on the first substrate 13 through a photolithography process including processes such as coating, exposing, developing, or the like of a photosensitive material and an etching process that selectively removes unnecessary portions.

A plurality of voltage lines 15 and 17 may be formed on the upper surface of the first substrate 13. The plurality of voltage lines 15 and 17 may be arranged in a plurality of rows and a plurality of columns to electrically connect between the micro pixel packages 100 arranged in a plurality of rows and a plurality of columns, and may be formed between package electrode pads 19 on which the micro pixel packages 100 are arranged.

FIG. 28 is a diagram illustrating a display module, according to an embodiment. For example, as shown in FIG. 28, each of the plurality of voltage lines 15 and 17 may be formed between two package electrode pads 19 that are adjacent to each other while being disposed in the same column. In this case, the plurality of voltage lines 15 and 17 may include a plurality of power supply voltage lines 15 for the power supply voltage $V_{DD}$ and a plurality of reference voltage lines 17 for the reference voltage $V_{SS}$.

Referring to FIG. 25, in operation 2540, the micro pixel packages may be disposed on the upper surface of the module substrate.

The package electrode pads 19, to which the micro pixel packages 100 may be electrically connected, may be arranged in a plurality of rows and a plurality of columns on the upper surface of the first substrate 13 corresponding to the module substrate.

In this case, the micro pixel package 100 may be disposed on the package electrode pad 19 and electrically connected to the first substrate 13. In other words, the micro pixel package 100 may be disposed on the first substrate 13 by electrically connecting a lower electrode pad provided in the micro pixel package 100 and the package electrode pad 19 formed on the upper surface of the first substrate 13. For example, the lower electrode pad and the package electrode pad 19 may be electrically connected by soldering or a conductive adhesive.

Figure 29:
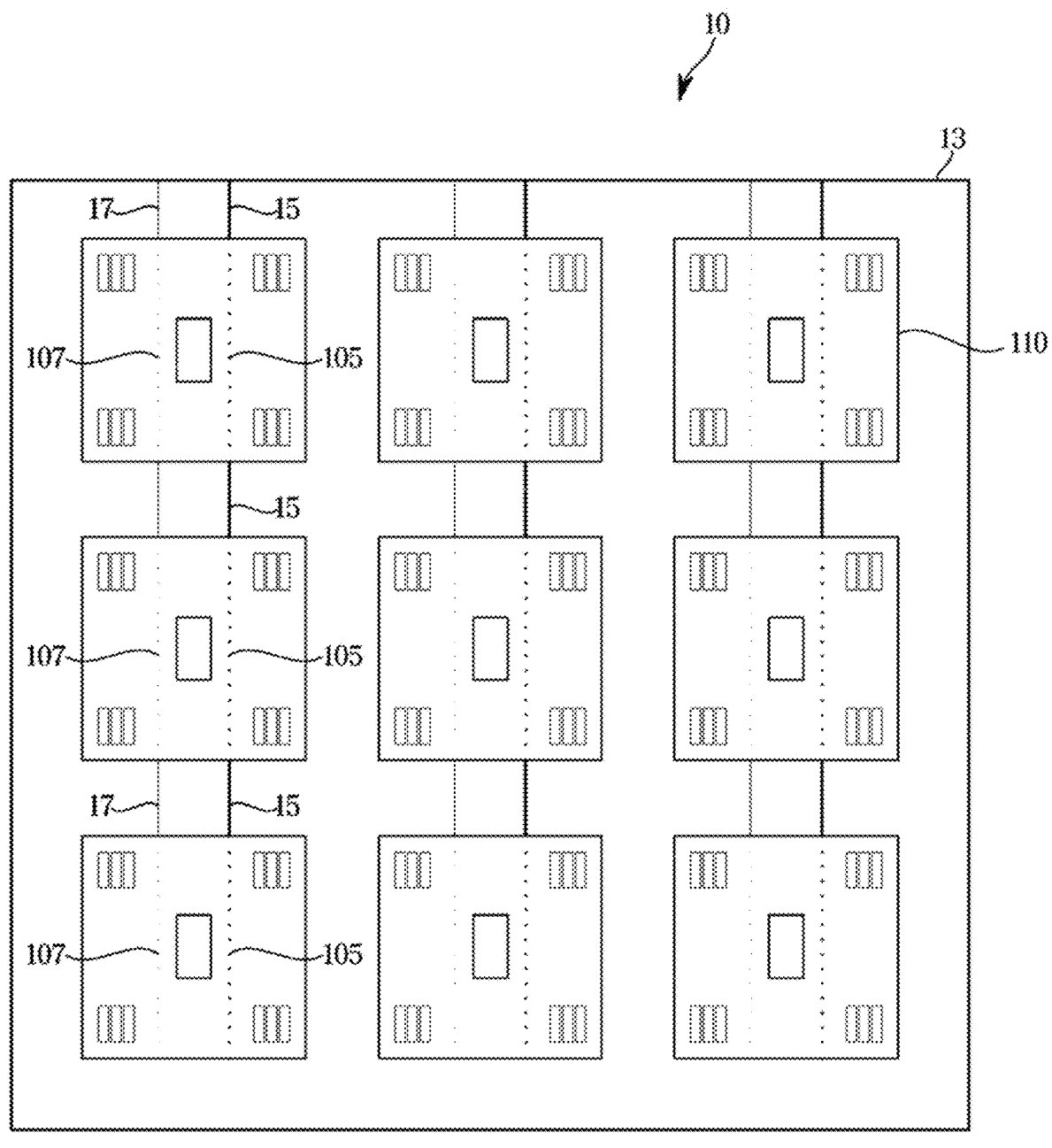

FIG. 29 is a diagram illustrating the upper surface of the first substrate 13 on which the micro pixel packages 100 are disposed according to an embodiment. As shown in FIG. 29, the plurality of micro pixel packages 100 may be arranged on the upper surface of the first substrate 13 in a two-dimensional array including a plurality of rows and a plurality of columns.

That is, the plurality of micro pixel packages 100 may be arranged two dimensionally on the first substrate 13, A micro pixel packages 100 may be disposed along the first direction (e.g., the column direction (i.e., the Z-axis direction)), and B micro pixel packages 100 may be disposed along the second direction (e.g., the row direction (i.e., the X-axis direction).

In other words, the plurality of micro pixel packages 100 may be arranged two dimensionally on the module substrate (the first substrate described below) of the display module 10, and each of the plurality of micro pixel packages 100 may be electrically connected to the micro pixel controllers adjacent thereto in the first direction. The first direction may correspond to, for example, the column direction (i.e., the Z-axis direction).

In this case, the internal connection lines 105 and 107 of each of the plurality of micro pixel packages 100 may be electrically connected to the voltage lines 15 and 17 electrically connected to the micro pixel package of a previous row and the voltage lines 15 and 17 electrically connected to the micro pixel package of a next row.

Accordingly, the internal connection lines 105 and 107 may electrically connect the voltage lines 15 and 17 connected to the micro pixel package of a previous row and the voltage lines connected to the micro pixel package 10 of a next row.

The internal connection lines 105 and 107 may include a first internal connection line 105 through which the power supply voltage $V_{DD}$ flows and a second internal connection line 107 through which the reference voltage $V_{SS}$ flows.

In other words, each of the plurality of micro pixel packages 100 may be electrically connected to the micro pixel package adjacent thereto in the first direction through the voltage lines provided on the module substrate, and may include the internal connection lines electrically connecting the voltage lines electrically connected to one of the micro pixel packages adjacent thereto in the first direction and the voltage lines electrically connected to another one of the micro pixel packages adjacent thereto in the first direction. Each of the plurality of micro pixel packages 100 may transmit a voltage input from one of the micro pixel packages, which is electrically connected thereto through the internal connection lines, to another one of the micro pixel packages, which is electrically connected thereto.

As a result, each of the plurality of micro pixel packages 100 may receive the power supply voltage $V_{DD}$ through a power supply voltage line 15a connected to the micro pixel package disposed in a previous row while being disposed in the same column, and may output the input power supply voltage $V_{DD}$ to a power supply voltage line 15b connected to the micro pixel package of a next row through the first internal connection line 105.

At this point, the micro pixel controller 130 may be electrically connected to the first internal connection line 105 through a voltage supply line 1005 and may receive the power supply voltage $V_{DD}$. That is, the first internal connection line 105 may be electrically connected to the micro pixel controller 130 and may transmit the power supply voltage $V_{DD}$.

In addition, each of the plurality of micro pixel packages 100 may receive the reference voltage $V_{SS}$ through a reference voltage line 17a connected to the micro pixel package disposed in a previous row while being disposed in the same column, and may output the input reference voltage $V_{SS}$ to a reference voltage line 17b connected to the micro pixel package of a next row through the second internal connection line 107.

At this point, each of the plurality of inorganic light-emitting elements 120 may be electrically connected to the second internal connection line 107 through a voltage supply line 1007 and may receive the reference voltage $V_{SS}$. That is, the second internal connection line 107 may be electrically connected to the plurality of inorganic light-emitting elements 120 and may transmit the reference voltage $V_{SS}$.

Referring to FIG. 25, in operation 2550, a driver IC 200 is connected to the module substrate.

The driver IC 200 may be electrically connected to the first substrate 13 by employing one of various bonding methods such as chip-on-film (COF) or film-on-glass (FOG) bonding, chip-on-glass (COG) bonding, and tape-automated bonding (TAB).

Figure 30:
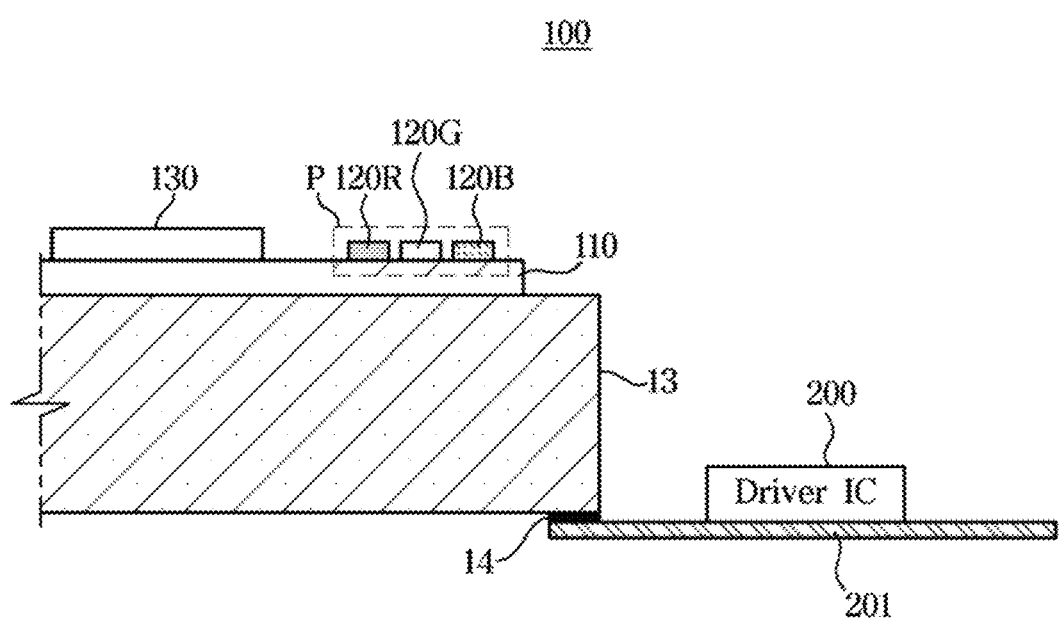

FIG. 30 is a diagram of the first substrate 13 to which the driver IC 200 is connected according to an embodiment. For example, when the COF bonding is employed, as shown in FIG. 30, the driver IC 200 is mounted on a film 201, and one end of the film 201 on which the driver IC 200 is mounted may be electrically connected to the first substrate 13.

For example, one end of the film 201 on which the driver IC 200 is mounted may be electrically connected to a lower electrode pad 14 provided on the lower surface of the first substrate 13, and the lower electrode pad 14, which is electrically connected to the film 201 on which the driver IC 200 is mounted may be connected to an upper line on which the micro pixel package 100 is disposed through a via line or a side surface line. The micro pixel package 100 may receive a gate signal and a data signal from the driver IC 200 through the corresponding upper line.

Referring to FIG. 25, in operation 2560, an FPCB is connected to the module substrate.

Figure 31:
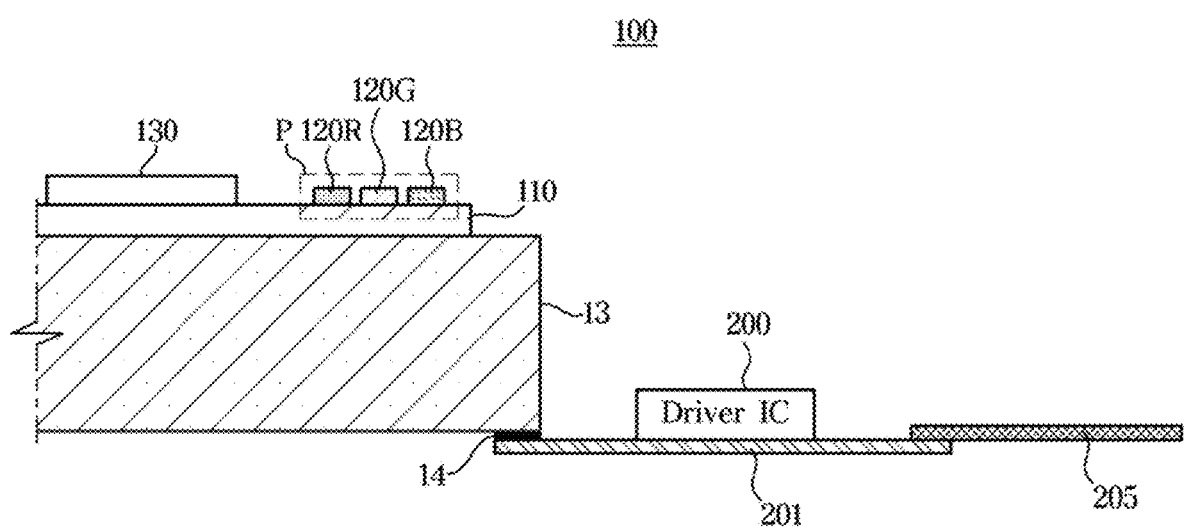

FIG. 31 is a diagram of the first substrate 13 to which an FPCB 205 is connected according to an embodiment. As in the example described above, when the COF bonding is employed, the other end of the film 201 on which the driver IC 200 is mounted may be electrically connected to the FPCB 205, as shown in FIG. 31.

The FPCB 205, which is connected to the film 201 on which the driver IC 200 is mounted, may be electrically connected to the driving board 501 and may transmit a timing control signal, image data, and the like output from the driving board 501 to the driver IC 200.

Further, the first substrate 13 may also be connected to an FPCB for receiving power, and the FPCB for supplying power may be electrically connected to the power board 601 and may supply the power supply voltage $V_{DD}$ or the reference voltage $V_{SS}$ to the micro pixel controller 130 or the inorganic light-emitting element 120. The power board 601 may be electrically connected to the first substrate 13 through the FPCB, and may be electrically connected to the micro pixel packages 100 of the first row 1600, which are arranged on the first substrate 13, through the lines to supply the power supply voltage $V_{DD}$ and the reference voltage $V_{SS}$.

The method of manufacturing the display module 10 according to one embodiment may include all of the above-described processes, but may also include only some of the above-described processes. Alternatively, other processes may be further added.

In addition, in the method of manufacturing the display module 10 according to one embodiment, the manufacture of the micro pixel package 100 may be omitted, and disposing some of the power lines in the micro pixel controller 130 may be included.

According to the embodiment, the method of manufacturing the display module 10 may include forming the internal connection lines 105 and 107 in the micro pixel controller 130, forming voltage lines 15 and 17 on the module substrate 13, arranging the micro pixel controller 130 and the inorganic light-emitting elements 120 on the module substrate 13, connecting the driver IC 200 to the module substrate 13, and connecting the FPCB 205 to the module substrate 13.

The disclosed embodiments may be implemented in the form of a recording medium storing instructions executable by a computer. The instructions may be stored in the form of program code and, when executed by a processor, may generate a program module to perform the operations of the disclosed embodiments. The recording medium may be implemented as a computer-readable recording medium.

The computer-readable recording medium includes all kinds of recording media in which instructions that may be read by a computer are stored. For example, there may be a read-only memory (ROM), a random access memory (RAM), a magnetic tape, a magnetic disk, a flash memory, an optical data storage, and the like.

The embodiments disclosed with reference to the accompanying drawings have been described above. It should be appreciated by those skilled in the art to which the present disclosure pertains that forms different from the disclosed embodiments may be implemented without departing from the technical spirit and essential features of the present disclosure. The disclosed embodiments are illustrative and should not be construed as limitative.

The invention claimed is:

1. A display module, comprising:
a first substrate;
a plurality of micro pixel packages provided on the first substrate; and
a plurality of voltage lines electrically connected between a set of micro pixel packages of the plurality of micro pixel packages that are adjacent to each other in a first direction,
wherein each of the plurality of micro pixel packages includes:
a second substrate;
a plurality of inorganic light-emitting elements provided on the second substrate;
a micro pixel controller provided on the second substrate and configured to control the plurality of inorganic light-emitting elements; and
an internal connection line disposed inside the second substrate and configured to electrically connect a first voltage line of the plurality of voltage lines that is electrically connected to a first micro pixel package of the set of micro pixel packages that are adjacent to each other in the first direction and a second voltage line of the plurality of voltage lines that is electrically connected to a second micro pixel package of the set of micro pixel packages that are adjacent to each other in the first direction.

2. The display module of claim 1, wherein each of the plurality of voltage lines is configured to transmit a voltage between the plurality of micro pixel packages.

3. The display module of claim 2, wherein each of the plurality of micro pixel packages is configured to receive a voltage through the first voltage line, and outputs an input voltage to the second voltage line through the internal connection line.

4. The display module of claim 3, wherein the internal connection line has an electron mobility higher than an electron mobility of each of the plurality of voltage lines.

5. The display module of claim 3, wherein the plurality of micro pixel packages include a first plurality of micro pixel packages, each of which is configured to receive a voltage from a power board and transmit the voltage to a micro pixel package that is adjacent thereto in the first direction through a corresponding voltage line, and a second plurality of micro pixel packages, each of which is configured to receive a voltage from a micro pixel package that is adjacent thereto in the first direction.

6. The display module of claim 3, wherein the internal connection line is electrically connected to the plurality of inorganic light-emitting elements and the micro pixel controller, and transmits a voltage input from any one of the set of micro pixel packages to each of the plurality of inorganic light-emitting elements and the micro pixel controller.

7. The display module of claim 6, wherein the internal connection line includes a first internal connection line through which a power supply voltage flows, and a second internal connection line through which a reference voltage flows,
wherein the first internal connection line is electrically connected to the micro pixel controller and transmits the power supply voltage thereto, and
the second internal connection line is electrically connected to the plurality of inorganic light-emitting elements and transmits the reference voltage thereto.

8. The display module of claim 1, wherein the display module comprises a plurality of pixels,
wherein each of the plurality of pixels includes at least two inorganic light-emitting elements among the plurality of inorganic light-emitting elements, and
wherein the plurality of inorganic light-emitting elements constitute at least two pixels among the plurality of pixels.

9. The display module of claim 1, wherein the micro pixel controller includes a third substrate, and at least one thin-film transistor disposed on the third substrate, and
wherein the at least one thin-film transistor is configured to switch the plurality of inorganic light-emitting elements and supply a driving current to the plurality of inorganic light-emitting elements.

10. A display apparatus, comprising:
a plurality of display modules; and
a frame configured to support the plurality of display modules,
wherein each of the plurality of display modules includes:
a first substrate;
a plurality of micro pixel packages provided on the first substrate; and a plurality of voltage lines electrically connected between a set of micro pixel packages that are adjacent to each other in a first direction, and wherein each of the plurality of micro pixel packages further includes:

a second substrate;

a plurality of inorganic light-emitting elements provided on the second substrate;

a micro pixel controller provided on the second substrate and configured to control the plurality of inorganic light-emitting elements; and an internal connection line disposed inside the second substrate and configured to electrically connect a first voltage line of the plurality of voltage lines that is electrically connected to a first micro pixel package of the set of micro pixel packages that are adjacent to each other in the first direction and a second voltage line of the plurality of voltage lines that is electrically connected to a second micro pixel package of the set of micro pixel packages that are adjacent to each other in the first direction.

11. The display apparatus of claim 10, wherein each of the plurality of voltage lines are configured to transmit a voltage between the set of micro pixel packages.

12. The display apparatus of claim 11, wherein each of the plurality of micro pixel packages is configured to receive a voltage through the first voltage line, and output an input voltage to the second voltage line through the internal connection line.

13. The display apparatus of claim 12, wherein the internal connection line has an electron mobility higher than an electron mobility of each of the plurality of voltage lines.

14. The display apparatus of claim 12, wherein the plurality of micro pixel packages include a first plurality of micro pixel packages, each of which is configured to receive a voltage from a power board and transmit the voltage to a micro pixel package that is adjacent thereto in the first direction through the second voltage line, and a second plurality of micro pixel packages, each of which is configured to receive a voltage from a micro pixel package that is adjacent thereto in the first direction.

15. The display apparatus of claim 12, wherein the internal connection line is electrically connected to the plurality of inorganic light-emitting elements and the micro pixel controller, and is configured to transmit a voltage input from any one of the set of micro pixel packages to each of the plurality of inorganic light-emitting elements and the micro pixel controller.

* * * * *